(12) United States Patent
Lee et al.

(10) Patent No.: US 11,915,773 B2
(45) Date of Patent: Feb. 27, 2024

(54) NONVOLATILE MEMORY DEVICE AND METHOD OF DETECTING WORDLINE DEFECT OF THE SAME

(71) Applicant: Samsung Electronics Co., Ltd., Suwon-si (KR)

(72) Inventors: Kyunghae Lee, Seosan-si (KR); Buil Nam, Hwaseong-si (KR); Jinsun Yeom, Suwon-si (KR); Sangwan Nam, Hwaseong-si (KR); Jaein Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 164 days.

(21) Appl. No.: 17/693,571

(22) Filed: Mar. 14, 2022

(65) Prior Publication Data
US 2023/0025237 A1    Jan. 26, 2023

(30) Foreign Application Priority Data
Jul. 22, 2021    (KR) .................. 10-2021-0096319

(51) Int. Cl.
*G11C 16/30*    (2006.01)
*G11C 16/04*    (2006.01)
(Continued)

(52) U.S. Cl.
CPC .......... *G11C 29/38* (2013.01); *G11C 16/0483* (2013.01); *G11C 16/08* (2013.01); *G11C 16/30* (2013.01); *G11C 29/12005* (2013.01)

(58) Field of Classification Search
CPC ...................................................... G11C 16/30
See application file for complete search history.

(56) References Cited

U.S. PATENT DOCUMENTS 8,498,831 B2    7/2013   Ide et al.
8,634,264 B2    1/2014   Yamada
(Continued)

FOREIGN PATENT DOCUMENTS

JP    20030172763 A    6/2003
JP    2007-0192635 A    8/2007
(Continued)

*Primary Examiner* — Jason Lappas
(74) *Attorney, Agent, or Firm* — Harness, Dickey & Pierce, P.L.C.

(57) ABSTRACT

A nonvolatile memory device includes a memory cell array, a voltage generator, a voltage path circuit and a wordline defect detection circuit. The memory cell array includes memory cells and wordlines connected to the memory cells. The voltage generator generates a wordline voltage applied to the wordlines. The voltage path circuit between the voltage generator and the memory cell array transfers the wordline voltage to the wordlines. The wordline defect detection circuit is connected to a measurement node between the voltage generator and the voltage path circuit. The wordline defect detection circuit measures a path leakage current of the voltage path circuit based on a measurement voltage of the measurement node to generate an offset value corresponding to the path leakage current in a compensation mode and determines defect of each wordline of the wordlines based on the offset value and the measurement voltage in a defect detection mode.

20 Claims, 18 Drawing Sheets

(51) Int. Cl.
    *G11C 16/08*    (2006.01)
    *G11C 29/12*    (2006.01)
    *G11C 29/38*    (2006.01)

(56) References Cited

U.S. PATENT DOCUMENTS

| | | |
|---|---|---|
| 10,482,973 B2 | 11/2019 | Lee et al. |
| 10,854,250 B2 | 12/2020 | Lee et al. |
| 2020/0090779 A1 | 3/2020 | Tokutomi et al. |
| 2020/0365211 A1* | 11/2020 | Nam ..................... G11C 16/30 |

FOREIGN PATENT DOCUMENTS

| | | |
|---|---|---|
| KR | 10-2019-0046330 A | 5/2019 |
| KR | 10-2019-0054720 A | 5/2019 |

\* cited by examiner

NONVOLATILE MEMORY DEVICE AND METHOD OF DETECTING WORDLINE DEFECT OF THE SAME

CROSS-REFERENCE TO RELATED APPLICATION

This U.S. non-provisional application claims priority under 35 USC § 119 to Korean Patent Application No. 10-2021-0096319, filed on Jul. 22, 2021, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a nonvolatile memory device and/or a method of detecting wordline defect of a nonvolatile memory device.

2. Discussion of the Related Art

Nonvolatile memory devices may maintain stored data even when power is off. While volatile memory devices may be used as main memories of various apparatuses, nonvolatile memory devices may be used for storing program codes and/or data in various electronic devices such as, for example, computers, mobile devices, etc.

Recently, nonvolatile memory devices with three-dimensional structures such as vertical NAND memory devices have been developed to increase the integration degree and memory capacity of nonvolatile memory devices. Along with increases in the integration degree and memory capacity, various types of defects such as bridge defect corresponding to undesired connection of adjacent wirings may be caused and performance and yield of nonvolatile memory devices may be degraded.

SUMMARY

Some example embodiments may provide a nonvolatile memory device and associated methods, capable of efficiently detecting wordline defect.

According to some example embodiments, a nonvolatile memory device includes a memory cell array, a voltage generator, a voltage path circuit and a wordline defect detection circuit. The memory cell array includes a plurality of cell strings and a plurality of wordlines. Each of the plurality of cell strings includes memory cells. Each of the plurality of wordlines is connected to at least one of the memory cells. Each of the plurality of cell strings is commonly connected between one of a plurality of bitlines and a source line. The voltage generator generates a wordline voltage applied to the plurality of wordlines. The voltage path circuit is connected between the voltage generator and the memory cell array. The voltage path circuit transfers the wordline voltage to the plurality of wordlines. The wordline defect detection circuit is connected to a measurement node between the voltage generator and the voltage path circuit. The wordline defect detection circuit measures a path leakage current of the voltage path circuit based on a measurement voltage of the measurement node to generate an offset value corresponding to the path leakage current in a compensation mode and determines defect of each wordline of the plurality of wordlines based on the offset value and the measurement voltage in a defect detection mode.

According to some example embodiments, a nonvolatile memory device includes a plurality of first metal pads in a cell region, a plurality of second metal pads in a peripheral region under the cell region, wherein the peripheral region is vertically connected to the cell region by the first metal pads and the second metal pads, a memory cell array in the cell region and including memory cells and a plurality of wordlines connected to the memory cells, a voltage generator in the peripheral region and configured to generate a wordline voltage applied to the plurality of wordlines, a voltage path circuit in the peripheral region, connected between the voltage generator and the memory cell array and configured to transfer the wordline voltage to the plurality of wordlines, and a wordline defect detection circuit in the peripheral region, connected to a measurement node between the voltage generator and the voltage path circuit. The wordline defect detection circuit measures a path leakage current of the voltage path circuit based on a measurement voltage of the measurement node to generate an offset value corresponding to the path leakage current in a compensation mode and determines defect of each wordline of the plurality of wordlines based on the offset value and the measurement voltage in a defect detection mode.

According to some example embodiments, a method of detecting wordline defect of a nonvolatile memory device includes measuring a path leakage current of a voltage path circuit to generate an offset value corresponding to the path leakage current in a compensation mode, the voltage path circuit providing a wordline voltage generated by a voltage generator to a plurality of wordlines and determining defect of each wordline of the plurality of wordlines based on the offset value in a defect detection mode.

The nonvolatile memory device and the method of detecting wordline defect according to some example embodiments may efficiently screen defective wordlines and enhance defect detection capability and yield of the nonvolatile memory device, by measuring the path leakage current of the voltage path circuit and determining criteria of wordline defect depending on the measured path leakage current.

In addition, the nonvolatile memory device and the method of detecting wordline defect according to some example embodiments may efficiently improve design and manufacturing process of the nonvolatile memory device by detecting the path leakage current independently of other leakage currents to exactly identify the defect source.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EXAMPLE EMBODIMENTS

Figure 1:
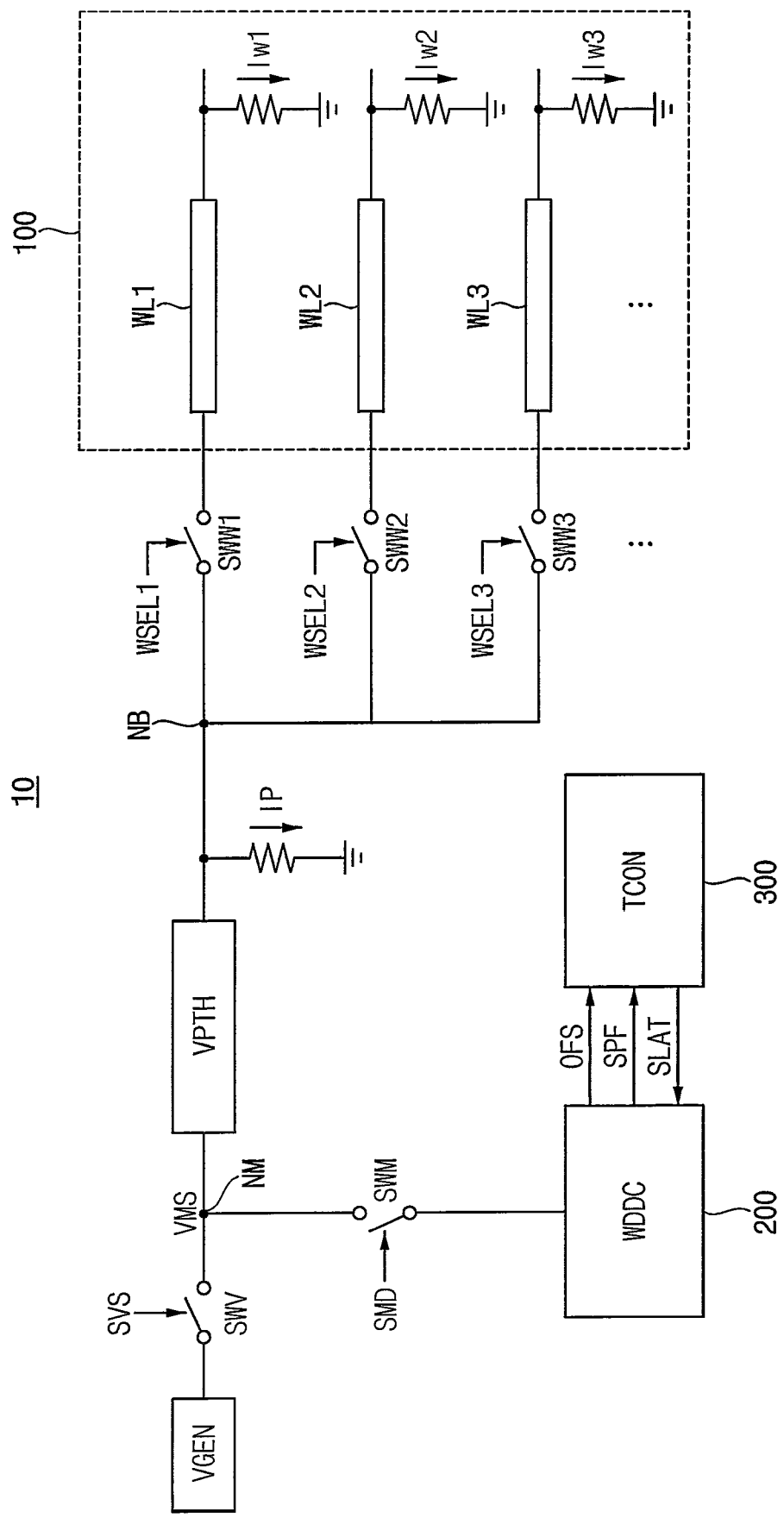
FIG. 1 is a diagram illustrating a nonvolatile memory device according to some example embodiments.

Various example embodiments will be described more fully hereinafter with reference to the accompanying drawings, in which some example embodiments are shown. In the drawings, like numerals refer to like elements throughout. The repeated descriptions may be omitted.

Figure 2:
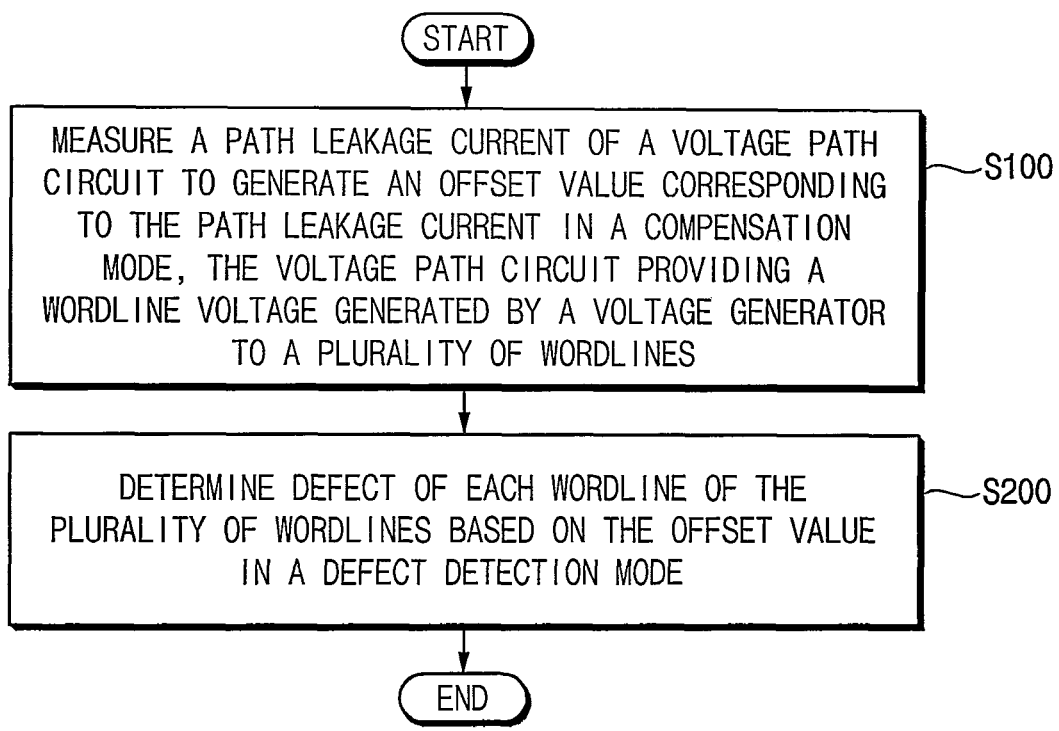
FIG. 2 is a flowchart illustrating a method of detecting wordline defect in a nonvolatile memory device according to some example embodiments.

FIG. 1 is a nonvolatile memory device according to some example embodiments, and FIG. 2 is a flowchart illustrating a method of detecting wordline defect in a nonvolatile memory device according to some example embodiments.

Referring to FIG. 1, a nonvolatile memory device 10 may include a memory cell array 100, a voltage generator VGEN, a voltage path circuit VPTH, a wordline defect detection circuit WDDC 200, a test controller TCON 300, a voltage switch SWV, a plurality of wordline switches SWW1~SWW3 and a mode switch SWM. FIG. 1 illustrates only elements for describing example embodiments and configuration and operation of the nonvolatile memory device 10 will be further described with reference to FIGS. 3 through 6. In some example embodiments, the voltage switch SWV, the plurality of wordline switches SWW1~SWW3 may be included in the voltage path circuit VPTH and/or the mode switch SWM may be included in the wordline defect detection circuit 200, and/or the test controller 300 may be included in a control circuit 450 illustrated in FIG. 4.

The memory cell array 100 may include memory cells and a plurality of wordlines WL1~WL3 connected to the memory cells. The memory cells are omitted and three wordlines are illustrated in FIG. 1 for convenience of illustration and description, and the number of wordlines commonly connected to the voltage path circuit VPTH may be determined by various methods. As will be described below with reference to FIGS. 6 and 16, the nonvolatile memory device 10 may be a vertical NAND flash memory device in which the memory cells are included and stacked in a vertical direction in each of a plurality of cell strings that are commonly connected between a plurality of bitlines and a source line.

The voltage generator VGEN may generate a wordline voltage applied to the plurality of wordlines WL1~WL3. The wordline voltage generated by the voltage generator VGEN will be described below with reference to FIG. 4.

The voltage path circuit VPTH may be connected between the voltage generator VGEN and the memory cell array 100 and configured to transfer the wordline voltage to the plurality of wordlines WL1~WL3. The voltage path circuit VPTH may include wirings, switches, voltage amplifiers, etc. to control the operation of the nonvolatile memory device 10. A path leakage current Ip of the voltage path circuit VPTH is illustrated in FIG. 1. The path leakage current Ip may be varied depending on manufacturing process conditions and/or operation conditions of the nonvolatile memory device 10.

The wordline defect detection circuit 200 may be connected to a measurement node NM between the voltage generator VGEN and the voltage path circuit VPTH. A compensation mode and a defect detection mode may be performed using the wordline defect detection circuit 200 as will be described below.

Referring to FIGS. 1 and 2, the wordline defect detection circuit 200 may measure the path leakage current Ip of the voltage path circuit VPTH based on a measurement voltage VMS of the measurement node NM to generate an offset value OFS corresponding to the path leakage current Ip in the compensation mode (S100). The wordline defect detection circuit 200 may be connected to the measurement node NM to measure the measurement voltage VMS.

In addition, the wordline defect detection circuit 200 may determine, for each of the wordlines WL1-WL3, whether a defect exits based on the offset value OFS and the measurement voltage VMS in the defect detection mode (S200). In some example embodiments, the wordline defect detection circuit 200 may determine a plurality of wordline leakage currents Iw1~Iw3 of the plurality of wordlines WL1~WL3 based on the offset value OFS and the measurement voltage VMS in the defect detection mode and determine defect of each wordline based on each of the plurality of wordline leakage currents Iw1~Iw3. The offset value OFS may be provided to the test controller 300, and the test controller 300 may generate a latch signal SLAT activated at a latch time point that is changed depending on the offset value OFS, as will be described below. The wordline defect detection circuit 200 may generate a pass-fail signal SPF indicating whether each wordline leakage current may be acceptable.

The voltage switch SWV may electrically connect the voltage generator VGEN to the measurement node NM based on a voltage switch signal SVS. The plurality of wordline switches SWW1~SWW3 may electrically connect the voltage path circuit VPTH to each wordline of the plurality of wordlines WL1~WL3 based on each wordline selection signal of a plurality of wordline selection signals WSEL1~WSEL3. The mode switch SWM may electrically connect the wordline defect detection circuit 200 to the measurement node NM based on a mode signal SMD. The voltage switch signal SVS, the plurality of wordline selection signals WSEL1~WSEL3 and the mode signal SMD may be generated by the test controller 300 or by another logic circuit under control of the test controller 300.

In the compensation mode as will be described below with reference to FIG. 8, the nonvolatile memory device 10 may deactivate all of the plurality of wordline selection signals WSEL1~WSEL3 to turn off all of the plurality of wordline switches SWW1~SWW3. In this case, the measurement voltage VMS may be decreased by the path leakage current Ip regardless of the plurality of wordline leakage currents Iw1~Iw3 of the plurality of wordlines WL1~WL3.

In the defect detection mode as will be described below with reference to FIG. 9, the nonvolatile memory device 10 may activate one wordline selection signal of the plurality of wordline selection signals WSEL1~WSEL3 and deactivate the other wordline selection signals to turn on one wordline switch of the plurality of wordline switches SWW1~SWW3 and turn off the other wordline switches. In this case, the measurement voltage VMS may be decreased by both of the path leakage current Ip and one wordline leakage current of one wordline corresponding to the one wordline switch that is turned on.

As will be described below with reference to FIGS. 8 and 9, the nonvolatile memory device 10 may activate the mode signal SMD to turn on the mode switch SWM in the compensation mode and the defect detection mode. In contrast, the nonvolatile memory device 10 may deactivate the mode signal SMD to turn off the mode switch SWM in a normal operation mode (e.g., a read operation mode, a write operation mode, etc.) of the nonvolatile memory device 10.

As density of a vertical NAND flash memory device is increased, a level of difficulty of etching process for channel holes is increased and defects due to structures adjacent to wordlines are increased. Conventionally the screening test to determine wordline defect has been performed based on fixed conditions that are predetermined regardless of characteristics of structures adjacent to the wordlines. The conventional scheme may screen the wordlines that are determined as being defective based on the fixed conditions even though the path leakage current Ip is changed according to change of the manufacturing process conditions. In addition, the conventional screening test has been performed with simultaneously measuring the wordline leakage current and the path leakage current. In such schemes, the screening level and the yield of the nonvolatile memory device may be varied according to the manufacturing process.

In contrast, the path leakage current Ip of the voltage path circuit VPTH corresponding to parasitic leakage component may be measured quantitatively and the circuit deviation may be compensated using the measured parasitic leakage component.

As such, the nonvolatile memory device and the method of detecting wordline defect according to some example embodiments may efficiently screen defective wordlines and enhance defect detection capability and yield of the nonvolatile memory device, by measuring the path leakage current of the voltage path circuit and determining criteria of wordline defect depending on the measured path leakage current.

In addition, the nonvolatile memory device and the method of detecting wordline defect according to some example embodiments may efficiently improve design and manufacturing process of the nonvolatile memory device by detecting the path leakage current independently of other leakage currents to exactly identify the defect source.

Figure 3:
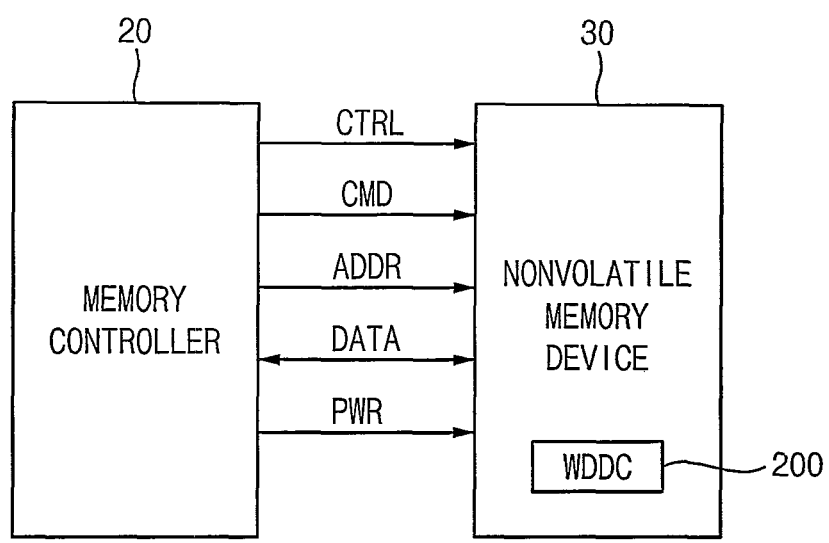
FIG. 3 is a block diagram illustrating a memory system according to some example embodiments.

FIG. 3 is a block diagram illustrating a memory system according to some example embodiments.

Referring to FIG. 3, a memory system 10 may include a memory controller 20 and at least one memory device 30.

The memory device 30 may be a nonvolatile memory device as described herein. The memory system 10 may include data storage media based on a flash memory such as, for example, a memory card, a universal serial bus (USB) memory and a solid state drive (SSD).

The nonvolatile memory device 30 may perform a read operation, an erase operation, and a program operation or a write operation under control of the memory controller 20. The nonvolatile memory device 30 receives a command signal CMD, an address signal ADDR and data DATA through input/output lines from the memory controller 20 for performing such operations. In addition, the nonvolatile memory device 30 receives a control signal CTRL through a control line from the memory controller 20. In addition, the nonvolatile memory device 30 receives power PWR through a power line from the memory controller 20.

According to some example embodiments, the nonvolatile memory device 30 may include a wordline defect detection circuit WDDC 200. As described above, the wordline defect detection circuit 200 may measure a path leakage current of the voltage path circuit based on a measurement voltage of the measurement node to generate an offset value corresponding to the path leakage current in a compensation mode and determine defect of each wordline of the plurality of wordlines based on the offset value and the measurement voltage in a defect detection mode.

Figure 4:
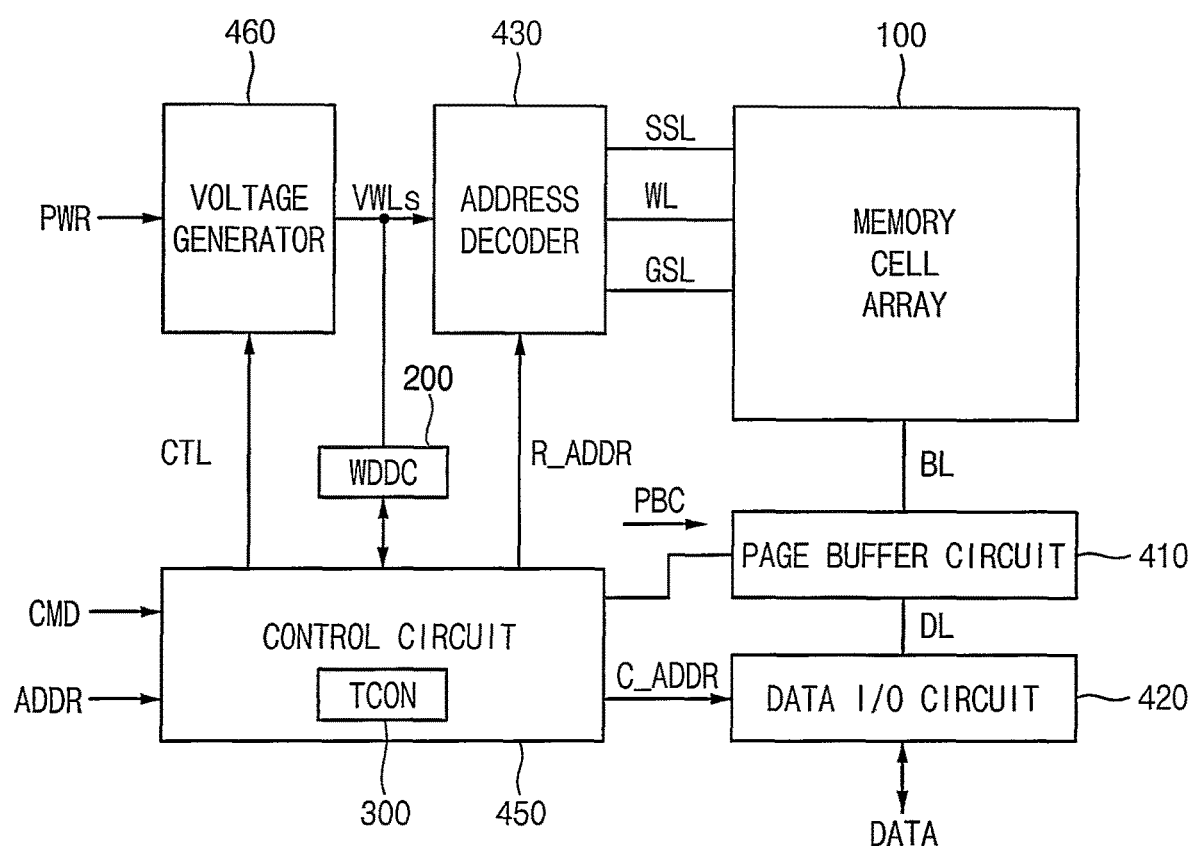
FIG. 4 is a block diagram illustrating a nonvolatile memory device according to some example embodiments.

FIG. 4 is a block diagram illustrating a nonvolatile memory device according to some example embodiments.

Referring to FIG. 4, the nonvolatile memory device 30 includes a memory cell array 100, a page buffer circuit 410, a data input/output circuit 420, an address decoder 430, a control circuit 450, a voltage generator 460, a wordline defect detection circuit WDDC 200 and a test controller TCON 300.

The memory cell array 100 may be coupled to the address decoder 430 through a plurality of string selection lines SSL, a plurality of wordlines WL, and a plurality of ground selection lines GSL. In addition, the memory cell array 100 may be coupled to the page buffer circuit 410 through a plurality of bitlines BL.

The memory cell array 100 may include a plurality of memory cells coupled to the plurality of wordlines WL and the plurality of bitlines BL. In some example embodiments, the memory cell array 100 may be a three-dimensional memory cell array, which is formed on a substrate in a three-dimensional structure (or a vertical structure). In this case, the memory cell array 100 may include a plurality of NAND strings that are vertically oriented such that at least one memory cell is located over another memory cell.

The control circuit 450 may receive a command signal CMD and an address signal ADDR from the memory controller 20. The control circuit 450 may control erase, programming and read operations of the nonvolatile memory device 30 based on the command signal CMD and the address signal ADDR. An erase operation may include performing a sequence of erase loops, and a program operation may include performing a sequence of program loops. Each program loop may include a program operation and a program verification operation. Each erase loop may include an erase operation and an erase verification operation. The read operation may include a normal read operation and a data recovery read operation.

For example, the control circuit 450 may generate control signals CTL, which are used for controlling the voltage generator 460, generate a page buffer control signal PBC for controlling the page buffer circuit 410, based on the command signal CMD, and generate a row address R_ADDR and a column address C_ADDR based on the address signal ADDR. The control circuit 450 may provide the row address R_ADDR to the address decoder 430 and provide the column address C_ADDR to the data input/output circuit 420.

The address decoder 430 may be coupled to the memory cell array 100 through the plurality of string selection lines SSL, the plurality of wordlines WL, and the plurality of ground selection lines GSL. During the program operation or the read operation, the address decoder 430 may determine one of the plurality of wordlines WL as a selected wordline and determine the rest of the plurality of wordlines WL, except for the selected wordline, as unselected wordlines, based on the row address R_ADDR.

In addition, during the program operation or the read operation, the address decoder 430 may determine one of the plurality of string selection lines SSL as a selected string selection line and determine the rest of the plurality of string selection lines SSL except for the selected string selection line as unselected string selection lines based on the row address R_ADDR.

The voltage generator 460 may generate wordline voltages VWL, which may be utilized for the operation of the memory cell array 100 of the nonvolatile memory device 30, based on the control signals CTL. The voltage generator 460 may receive the power PWR from the memory controller 20. The wordline voltages VWL may be applied to the plurality of wordlines WL through the address decoder 430.

For example, during the program operation, the voltage generator 460 may apply a program voltage to the selected wordline and apply a program pass voltage to the unselected wordlines. In addition, during the program verification operation, the voltage generator 460 may apply a program verification voltage to the selected wordline and apply a verification pass voltage to the unselected wordlines. In addition, during the normal read operation, the voltage generator 460 may apply a read voltage to the selected wordline and apply a read pass voltage to the unselected wordlines.

The page buffer circuit 410 may be coupled to the memory cell array 100 through the plurality of bitlines BL. The page buffer circuit 410 may include a plurality of buffers. In some example embodiments, each buffer may be connected to one bitline. In some example embodiments, each buffer may be connected to two or more bitlines. The page buffer circuit 410 may temporarily store data to be programmed in a selected page or data read out from the selected page of the memory cell array 100.

The data input/output circuit 420 may be coupled to the page buffer circuit 410 through data lines DL. During the program operation, the data input/output circuit 420 may receive program data DATA received from the memory controller 20 and provide the program data DATA to the page buffer circuit 410 based on the column address C_ADDR received from the control circuit 450. During the read operation, the data input/output circuit 420 may provide read data DATA, having been read from the memory cell array 100 and stored in the page buffer circuit 410, to the memory controller 20 based on the column address C_ADDR received from the control circuit 450.

As described above, the wordline defect detection circuit 200 may measure a path leakage current of the voltage path circuit based on a measurement voltage of the measurement node to generate an offset value corresponding to the path leakage current in a compensation mode and determine defect of each wordline of the plurality of wordlines based on the offset value and the measurement voltage in a defect detection mode.

The test controller 300 may generate control signals to control the compensation mode and the defect detection mode of the wordline defect detection circuit 200. For example, the test controller 300 may generate the voltage switch signal, the wordline selection signals and the mode signal as described above. In addition, the test controller 300 may receive the offset value from the wordline defect detection circuit 200 and control activation timing of the latch signal based on the offset value.

The test controller 300 may be included in the control circuit 450 as illustrated in FIG. 4. According to some example embodiments, the test controller 300 may be a distinct circuit disposed out of the control circuit or disposed in an external device such as a memory controller, a tester device, etc.

Hereinafter, a third direction D3 indicates a direction perpendicular to an upper surface of a semiconductor substrate, and a first direction D1 and a second direction D2 indicate two directions parallel to the upper surface of the semiconductor substrate. For example, the first direction D1 and the second direction D2 may be perpendicular to each other. The third direction D3 may be referred to as a vertical direction, the first direction D1 may be referred to as a row direction and the second direction D2 may be referred to as a column direction. The direction indicated by an arrow in figures and the opposite direction may be considered as the same direction.

Figure 5:
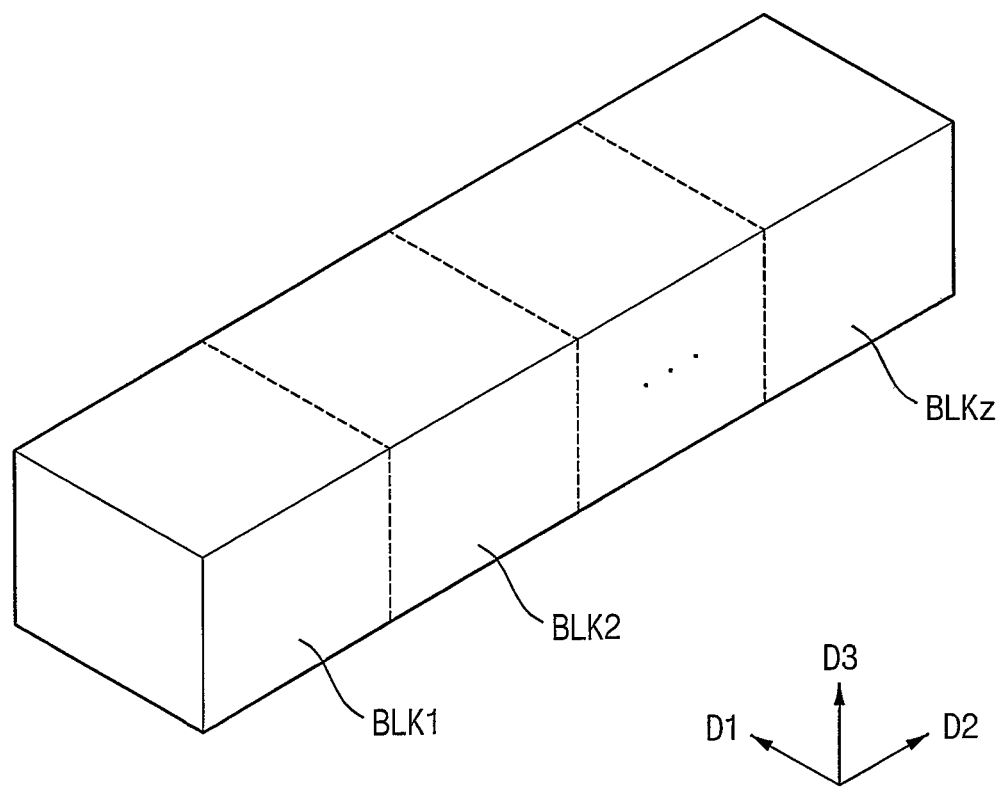
FIG. 5 is a block diagram illustrating a memory cell array included in the nonvolatile memory device of FIG. 4.
Figure 6:
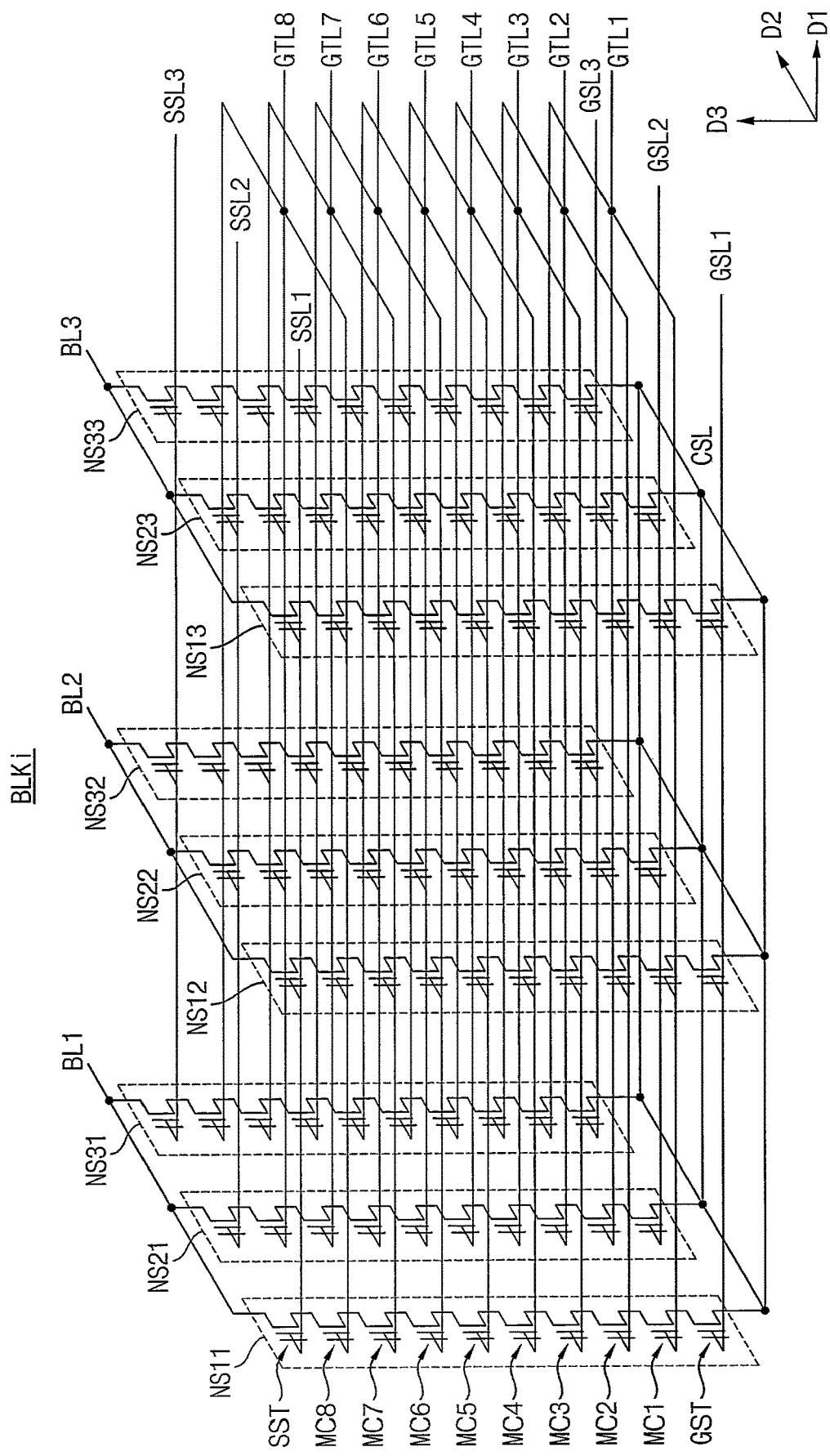
FIG. 6 is a diagram illustrating an equivalent circuit of one of the plurality of memory blocks of FIG. 5.

FIG. 5 is a block diagram illustrating a memory cell array included in the nonvolatile memory device of FIG. 4, and FIG. 6 is a diagram illustrating an equivalent circuit of one of the plurality of memory blocks of FIG. 5.

Referring to FIG. 5, the memory cell array 100 may include a plurality of memory blocks BLK1 to BLKz, in which n is a natural number. In an example embodiment, the memory blocks BLK1 to BLKz are selected by the address decoder 430 in FIG. 4. For example, the address decoder 430 may select a particular memory block BLK corresponding to a block address among the memory blocks BLK1 to BLKz.

The memory block BLKi of FIG. 6, which may correspond to one of the memory blocks BLK1 to BLKz of FIG. 5, may be formed on a substrate in a three-dimensional structure (or a vertical structure). For example, NAND strings or cell strings included in the memory block BLKi may be formed in the third direction D3 perpendicular to the upper surface of the substrate.

Referring to FIG. 6, the memory block BLKi may include NAND strings NS11, NS21, NS311, NS12, NS22, NS32, NS13, NS23 and NS33 coupled between bitlines BL1, BL2 and BL3 and a common source line CSL. Each of the NAND strings NS11 to NS33 may include a string selection transistor SST, a memory cells MC1, MC2, MC3, MC4, MC5, MC6, MC7 and MC8, and a ground selection transistor GST. In FIG. 6, each of the NAND strings NS11 to NS33 is illustrated as including eight memory cells MC1 to MC8. However, example embodiments are not limited thereto. For example, in some example embodiments, each of the NAND strings NS11 to NS33 may include any number of memory cells.

Each string selection transistor SST may be connected to a corresponding string selection line (one of SSL1 to SSL3). The memory cells MC1 to MC8 may be connected to corresponding gate lines GTL1, GTL2, GTL3, GTL4, GTL5, GTL6, GTL7 and GTL8, respectively. The gate lines GTL1 to GTL8 may be wordlines, and some of the gate lines GTL1 to GTL8 may be dummy wordlines. Each ground selection transistor GST may be connected to a corresponding ground selection line (one of GSL1, GSL2 and GSL3). Each string selection transistor SST may be connected to a corresponding bitline (e.g., one of BL1, BL2 and BL3), and each ground selection transistor GST may be connected to the common source line CSL.

Wordlines (e.g., WL1) having the same height may be commonly connected, and the ground selection lines GSL1 to GSL3 and the string selection lines SSL1 to SSL3 may be separated. In FIG. 6, the memory block BLKi is illustrated as being coupled to eight gate lines GTL1 to GTL8 and three bitlines BL1 to BL3. However, example embodiments are not limited thereto. For example, in some example embodiments, each memory block in the memory cell array may be coupled to any number of wordlines and any number of bitlines.

In FIG. 6, each cell string includes one string selection transistor SST and one ground selection transistor GST. However, example embodiments are not limited thereto. For example, in some example embodiments, each cell string may include two or more string selection transistors SST and two or more ground selection transistors GST.

Figure 7:
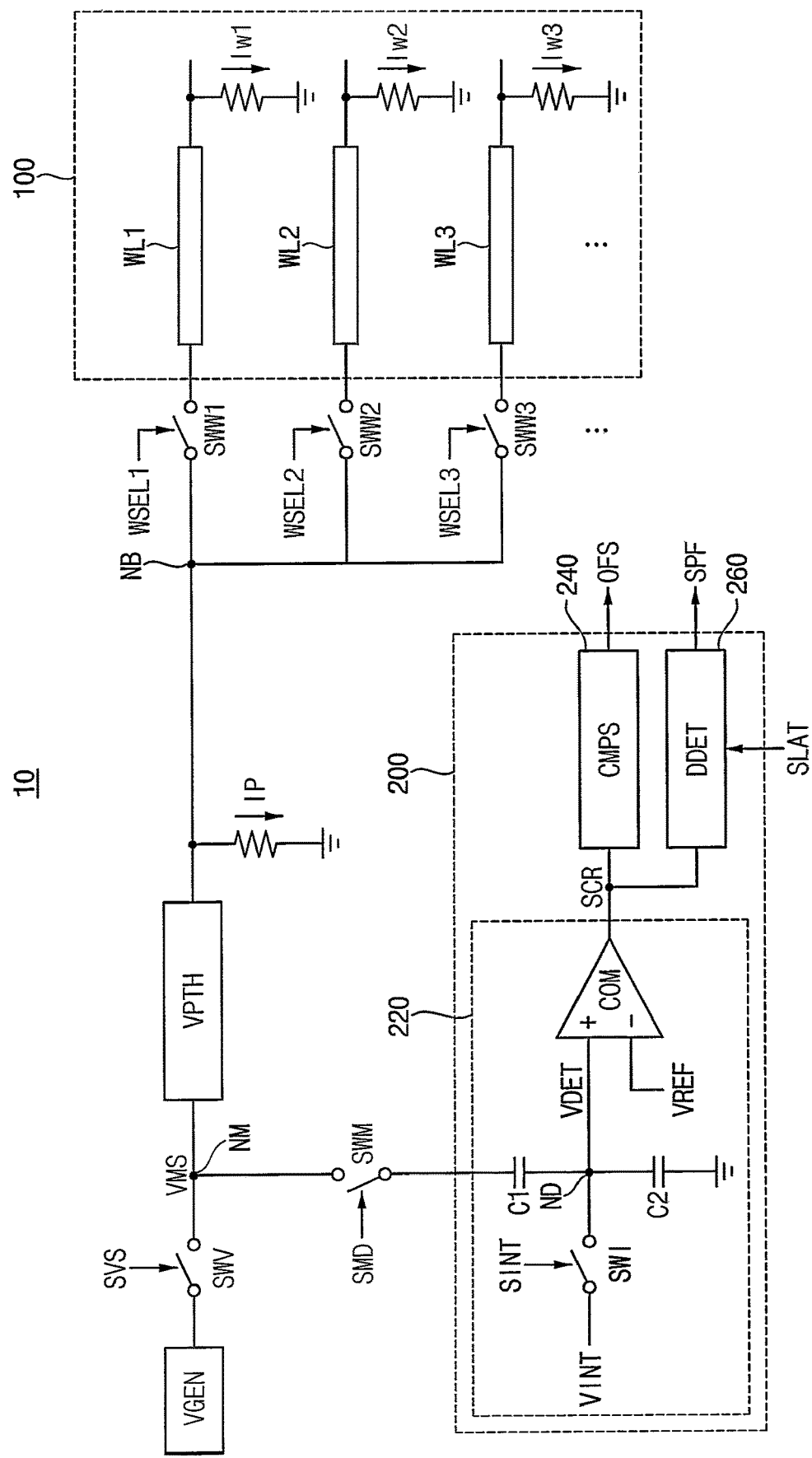
FIG. 7 is a diagram illustrating a nonvolatile memory device according to some example embodiments.

FIG. 7 is a diagram illustrating a nonvolatile memory device according to some example embodiments. Hereinafter, descriptions repeated with FIG. 1 may be omitted.

Referring to FIG. 7, a nonvolatile memory device 10 may include a memory cell array 100, a voltage generator VGEN, a voltage path circuit VPTH, a wordline defect detection circuit WDDC 200, a test controller TCON 300, a voltage switch SWV, a plurality of wordline switches SWW1~SWW3 and a mode switch SWM.

The memory cell array 100 may include memory cells and a plurality of wordlines WL1~WL3 connected to the memory cells. The voltage generator VGEN may generate a wordline voltage applied to the plurality of wordlines WL1~WL3. The voltage path circuit VPTH may be connected between the voltage generator VGEN and the memory cell array 100 and configured to transfer the wordline voltage to the plurality of wordlines WL1~WL3.

The wordline defect detection circuit 200 may include a comparison circuit 200, a compensation circuit CMPS 240 and a defect determination circuit DDET 260.

The comparison circuit 220 may generate a comparison result signal SCR based on a reference voltage VREF and the measurement voltage VMS decreasing by the path leakage current Ip in the compensation mode. In addition, the comparison circuit 220 may generate the comparison result signal SCR based on the reference voltage VREF and the measurement voltage VMS decreasing by both of the path leakage current Ip and each wordline leakage current Iwi (i=1,2,3) in the defect detection mode.

In some example embodiments, as illustrated in FIG. 7, the comparison circuit 220 may include a first capacitor C1 connected between the measurement node NM and a detection node ND, a second capacitor C2 connected between the detection node ND and a ground voltage, and a comparator COM. The comparator COM may compare a detection voltage VDET of the detection node ND and the reference voltage VREF to generate the comparison result signal SCR.

In some example embodiments, the comparator COM may receive the detection voltage VDET at a positive input terminal (+) and the reference voltage VREF at a negative input terminal (−). In this case, the comparison result signal SCR may have a logic high level when the detection voltage VDET is higher than the reference voltage VREF and the comparison result signal SCR may have a logic low level when the detection voltage VDET is lower than the reference voltage VREF.

The first capacitor C1 and the second capacitor C2 may function as a capacitive voltage division circuit. The detection voltage VDET of the detection node ND and the measurement voltage VMS of the measurement node NM may be linearly proportional to a capacitance ratio of the first capacitor C1 and the second capacitor C2.

In some example embodiments, the comparison circuit 220 may further include an initialization switch SWI. The initialization switch SWI may reset the detection voltage VDET or the detection node ND to an initialization voltage VINT based on an initialization signal SINT. Uncertainty of the voltage level of the detection node ND may be removed and operation errors may be prevented by reset the detection node ND with the initialization voltage VINT.

The compensation circuit 240 may generate the offset value OFS based on transition timing of the comparison result signal SCR in the compensation mode. Example embodiments of the compensation circuit 240 will be described below with reference to FIGS. 10 and 11.

The defect determination circuit 260 may generate a pass-fail signal SPF indicating defect of each wordline based on a logic level of the comparison result signal SCR at a latch time point that is determined based on the offset value OFS in the defect detection mode.

In some example embodiments, the defect determination circuit 260 may include a latch circuit. The latch circuit may latch a logic level of the comparison result signal SCR based on a latch signal SLAT that is activated at the latch time point to output the pass-fail signal SPF.

The voltage switch SWV may electrically connect the voltage generator VGEN to the measurement node NM based on a voltage switch signal SVS. The plurality of wordline switches SWW1~SWW3 may electrically connect the voltage path circuit VPTH to each wordline of the plurality of wordlines WL1~WL3 based on each wordline selection signal of a plurality of wordline selection signals WSEL1~WSEL3. The mode switch SWM may electrically connect the wordline defect detection circuit 200 to the measurement node NM based on a mode signal SMD. The voltage switch signal SVS, the plurality of wordline selection signals WSEL1~WSEL3 and the mode signal SMD may be generated by the test controller 300 or by another logic circuit under control of the test controller 300.

Figure 8:
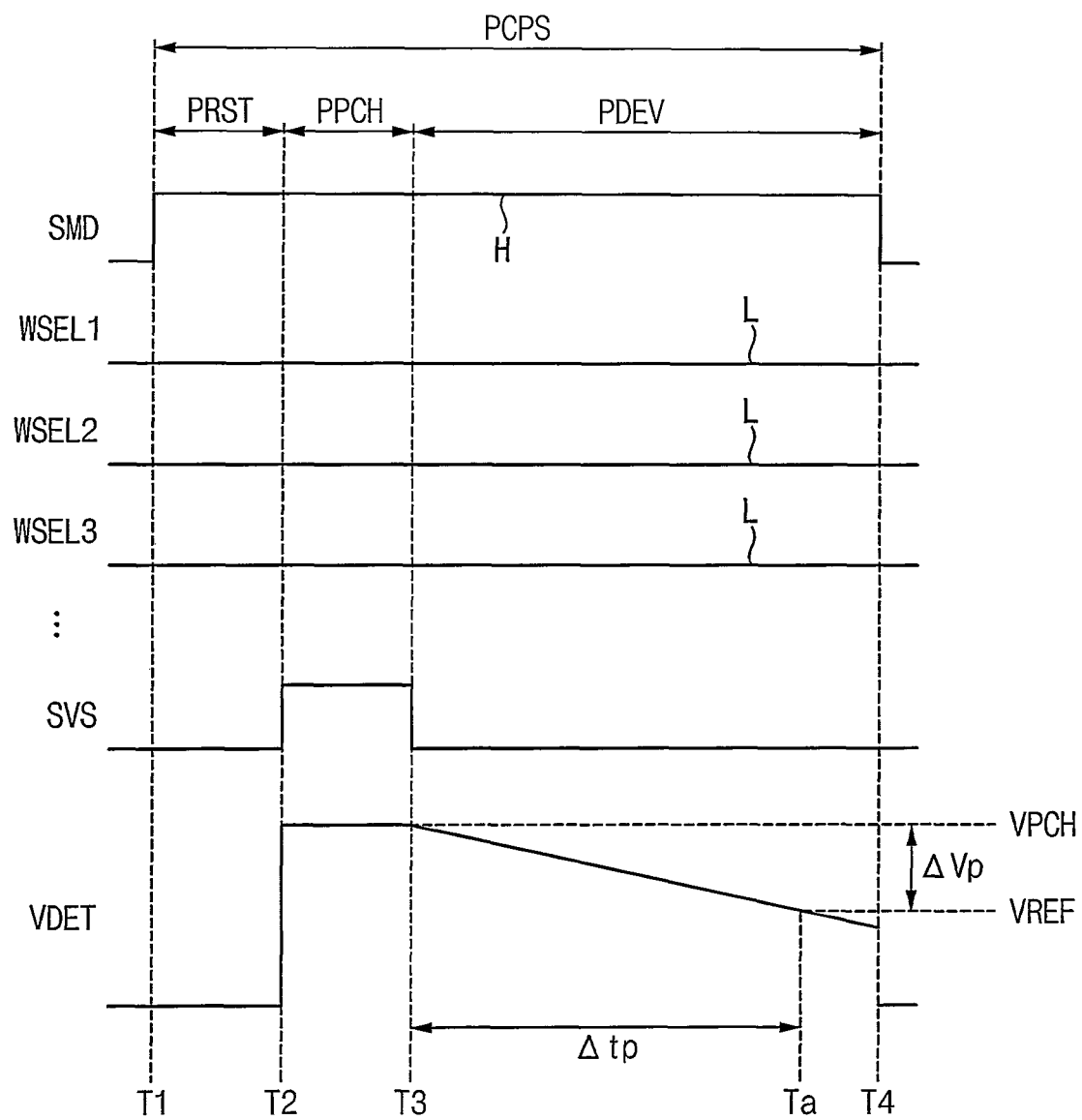
FIG. 8 is a timing diagram illustrating an example embodiment of an operation in a compensation mode of a nonvolatile memory device according to some example embodiments.

FIG. 8 is a timing diagram illustrating an example embodiment of an operation in a compensation mode of a nonvolatile memory device according to some example embodiments.

FIG. 8 illustrates the mode signal SMD, waveforms or transition timing of the plurality of wordline selection signals WSEL1~WSEL3, the voltage switch signal SVS and the detection voltage VDET in a compensation period PCPS for measuring the path leakage current Ip. The compensation period PCPS may include a reset period PRST, a precharge period PPCH and a develop period PDEV between time points T1~T4.

Referring to FIGS. 7 and 8, the nonvolatile memory device 10 may activate the mode signal SMD to turn on the mode switch SWM in the compensation period PCPS performing the compensation mode. In addition, the nonvolatile memory device 10 may deactivates all of the plurality of wordline selection signals WSEL1~WSEL3 to turn off all of the plurality of wordline switches SWW1~SWW3. For example, the mode signal SMD and the plurality of wordline selection signal WSEL1~WSEL3 be activated in the logic high level H and deactivated in the logic low level L, but example embodiments are not limited to the specific logic levels.

In the reset period PRST, the nonvolatile memory device 10 may initialize the operation status of the nonvolatile memory device 10.

In the precharge period PPCH, the nonvolatile memory device 10 may activate the voltage switch signal SVS to turn on the voltage switch SWV. By turning-on of the voltage switch SWV, the measurement voltage VMS of the measurement node NM may be charged with the wordline voltage generated by the voltage generator VGEN and the detection voltage VDET of the detection node ND may be charged with a precharge voltage VPCH that is proportional to the measurement voltage VMS.

At the path develop start time point T3 when the voltage switch signal SVS is deactivated, the measurement voltage VMS starts decreasing by the path leakage current Ip and thus the detection voltage VDET, which is proportional to the measurement voltage VMS, starts to decrease.

In the develop period PDEV, all of the plurality of wordline switches SWW1~SWW3 are in the turned-off state and the measurement voltage VMS may decrease by the path leakage current Ip regardless of the plurality of wordline leakage currents Iw1~Iw3. The detection voltage VDET may decrease with a slope corresponding to the path leakage current Ip. A time between time points T3 and Ta while the detection voltage VDET decreases by ΔVp from the precharge voltage VPCH may referred to as a leakage time Δtp. The compensation circuit 240 may measure the leakage time Δtp elapsed until the detection voltage VDET becomes equal to the reference voltage VREF and generate the above-described offset value OFS such that the offset value OFS may be proportional to the leakage time Δtp. The generation of the offset value OFS based on the leakage time Δtp will be further described with reference to FIGS. 12 and 13.

As such, the compensation circuit 240 of the wordline defect detection circuit 200 may measure the leakage time Δtp, which is inversely proportional to the path leakage current Ip, based on the measurement voltage VMS and the reference voltage VREF in the compensation mode and generate the offset value OFS that is proportional to the leakage time Δ tp.

Figure 9:
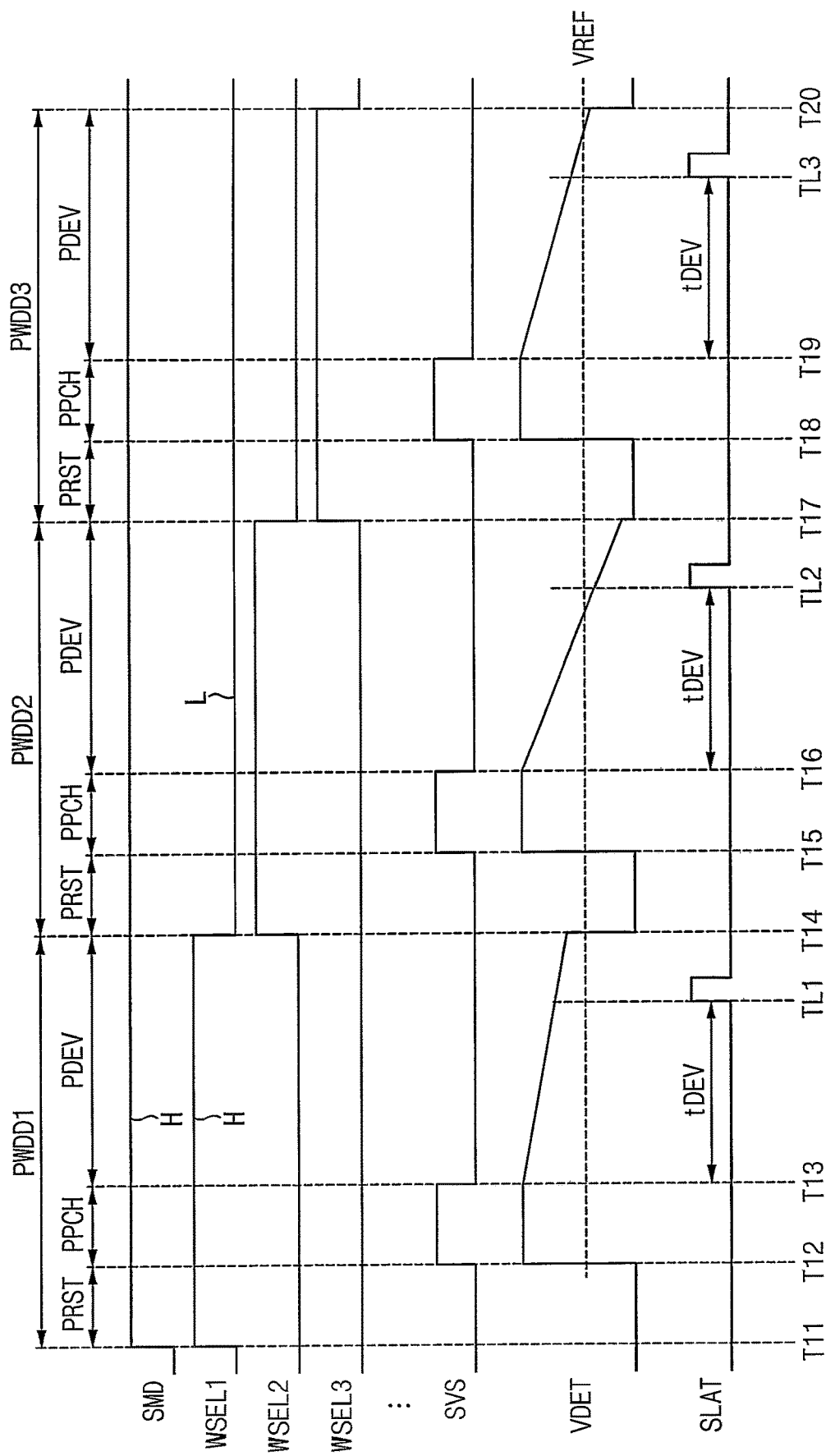
FIG. 9 is a timing diagram illustrating an example embodiment of an operation in a defect detection mode of a nonvolatile memory device according to some example embodiments.

FIG. 9 is a timing diagram illustrating an example embodiment of an operation in a defect detection mode of a nonvolatile memory device according to some example embodiments.

FIG. 9 illustrates the mode signal SMD, waveforms or transition timing of the plurality of wordline selection signals WSEL1~WSEL3, the voltage switch signal SVS, the detection voltage VDET and the latch signal SLAT in a first defect determination period PWDD1 for determining defect of the first wordline WL1, a second defect determination period PWDD2 for determining defect of the second wordline WL2 and a third defect determination period PWDD3 for determining defect of the third wordline WL3. Each of the first through third defect determination periods PWDD1~PWDD3 may include a reset period PRST, a precharge period PPCH and a develop period PDEV between time points T11~T20.

Referring to FIGS. 7 and 9, the nonvolatile memory device 10 may activate the mode signal SMD to turn on the mode switch SWM in the first through third defect determination periods PWDD1~PWDD3 performing the defect detection mode. In addition, the nonvolatile memory device 10 may activate one wordline selection signal of the plurality of wordline selection signals WSEL1~WSEL3 and deactivates the other wordline selection signals to turn on one wordline switch of the plurality of wordline switches and turn off the other wordline switches. In other words, as illustrated in FIG. 9, only the first wordline selection signal WSEL1 may be activated and the second and third wordline selection signals WSEL2 and WSEL3 may be deactivated in the first defect determination period PWDD1, only the second wordline selection signal WSEL2 may be activated and the first and third wordline selection signals WSEL1 and WSEL3 may be deactivated in the second defect determination period PWDD2, and only the third wordline selection signal WSEL3 may be activated and the first and second wordline selection signals WSEL1 and WSEL2 may be deactivated in the third defect determination period PWDD3.

In the reset period PRST, the nonvolatile memory device 10 may initialize the operation status of the nonvolatile memory device 10.

In the precharge period PPCH, the nonvolatile memory device 10 may activate the voltage switch signal SVS to turn on the voltage switch SWV. By turning-on of the voltage switch SWV, the measurement voltage VMS of the measurement node NM may be charged with the wordline voltage generated by the voltage generator VGEN and the detection voltage VDET of the detection node ND may be charged with a precharge voltage VPCH that is proportional to the measurement voltage VMS.

At the path develop start time point T13 in the first defect determination period PWDD1, the measurement voltage VMS starts decreasing by the path leakage current Ip and the first wordline leakage current Iw1 and thus the detection voltage VDET, which is proportional to the measurement voltage VMS, starts to decrease. At the path develop start time point T16 in the second defect determination period PWDD2, the measurement voltage VMS starts decreasing by the path leakage current Ip and the second wordline leakage current Iw2 and thus the detection voltage VDET starts to decrease. At the path develop start time point T16 in the third defect determination period PWDD3, the measurement voltage VMS starts decreasing by the path leakage current Ip and the third wordline leakage current Iw3 and thus the detection voltage VDET starts to decrease. As such, the measurement voltage VMS and the detection voltage VDET proportional to the measurement voltage VMS may decrease by the path leakage current Ip and each wordline leakage current.

In the develop period PDEV of the first defect determination period PWDD1, the detection voltage VDET may decrease with a slope corresponding to a sum of the path leakage current Ip and the first wordline leakage current Iw1. In the develop period PDEV of the second defect determination period PWDD2, the detection voltage VDET may decrease with a slope corresponding to a sum of the path leakage current Ip and the second wordline leakage current Iw2. In the develop period PDEV of the third defect determination period PWDD3, the detection voltage VDET may decrease with a slope corresponding to a sum of the path leakage current Ip and the third wordline leakage current Iw3.

In the defect detection mode, the defect determination circuit 260 of the wordline defect detection circuit 200 may determine whether each wordline leakage current of each wordline exceeds a threshold value, based on the measurement voltage VMS and the reference voltage VREF at each of latch time points TL1, TL2 and TL3 that are determined based on the offset value OFS. The defect determination circuit 260 may determine the defect of each wordline based on a result of determining whether each wordline leakage exceeds the threshold value and generate the pass-fail signal SPF indicating whether each wordline is defective. For example, a first logic level of the pass-fail signal SPF may indicate that the corresponding wordline is normal and a second logic level of the pass-fail signal SPF may indicate that the corresponding wordline is defective, For example, as illustrated in FIG. 9, it is determined that the first and third wordline leakage currents Iw1 and Iw3 do not exceed the threshold value because the detection voltage VDET proportional to the measurement voltage VMS is higher than the reference voltage VREF at the latch time points TL1 and TL3 of the first and third defect determination periods PWDD1 and PWDD3. In contrast, it is determined that the second wordline leakage current Iw2 exceeds the threshold value because the detection voltage VDET proportional to the measurement voltage VMS is lower than the reference voltage VREF at the latch time point TL2 of the second defect determination period PWDD2. As a result, the first and third wordlines WL1 and WL3 may be determined as being normal and the second wordline WL2 may be determined as being defective.

FIG. 9 illustrates a wordline develop time tDEV between each the wordline develop start time points T13, T16 and T19 and each of the latch time points TL1, TL2 and TL3. As will be described below with reference to FIGS. 12 and 13, the test controller 300 in FIG. 1 may control transition timing of the latch signal SLAT such that the develop time tDEV may be proportional to the offset value OFS.

Figure 10:
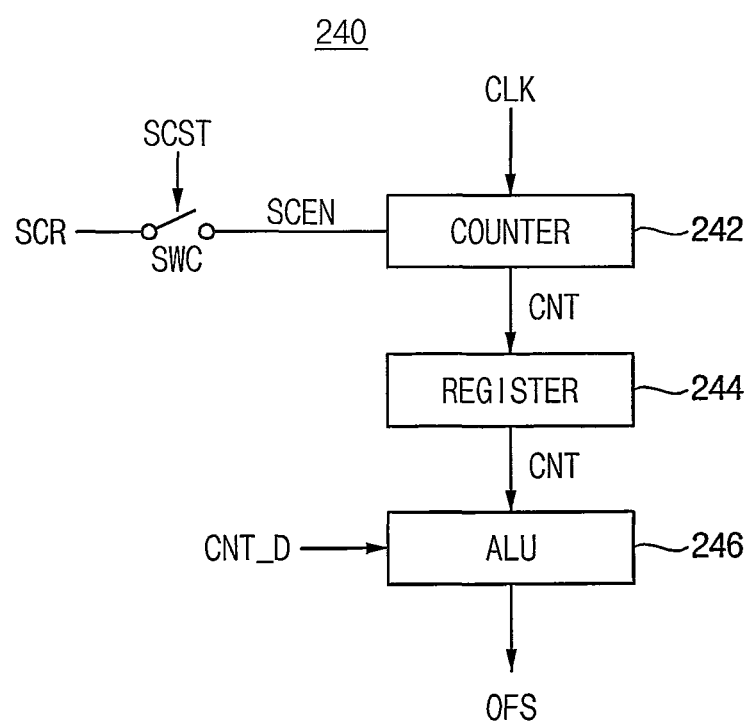
FIG. 10 is a diagram illustrating an example embodiment of a compensation circuit included in a wordline defect detection circuit according to some example embodiments.

FIG. 10 is a diagram illustrating an example embodiment of a compensation circuit included in a wordline defect detection circuit according to some example embodiments.

Referring to FIG. 10, a compensation circuit 240 may include a counter input switch SWC, a counter 242, a register 244 and a calculation circuit ALU 246.

The counter input switch SWC may be connected to an output node of the comparison circuit 220 providing the comparison result signal SCR. The counter input switch SWC may be turned on based on a counting start signal SCST to generate a counting enable signal SCEN. The counting start signal SCST may be generated by the test controller 300.

The counter 242 may count a clock number of a clock signal CLK during an activation time duration of the counting enable signal SCEN to provide a count value CNT indicating the leakage time Δtp that is inversely proportional to the path leakage current Ip.

The register 244 may store the count value CNT provided from the counter 242.

The calculation circuit 246 may subtract a default count value CNT_D from the count value CNT stored in the register 244 to provide the offset value OFS.

Figure 11:
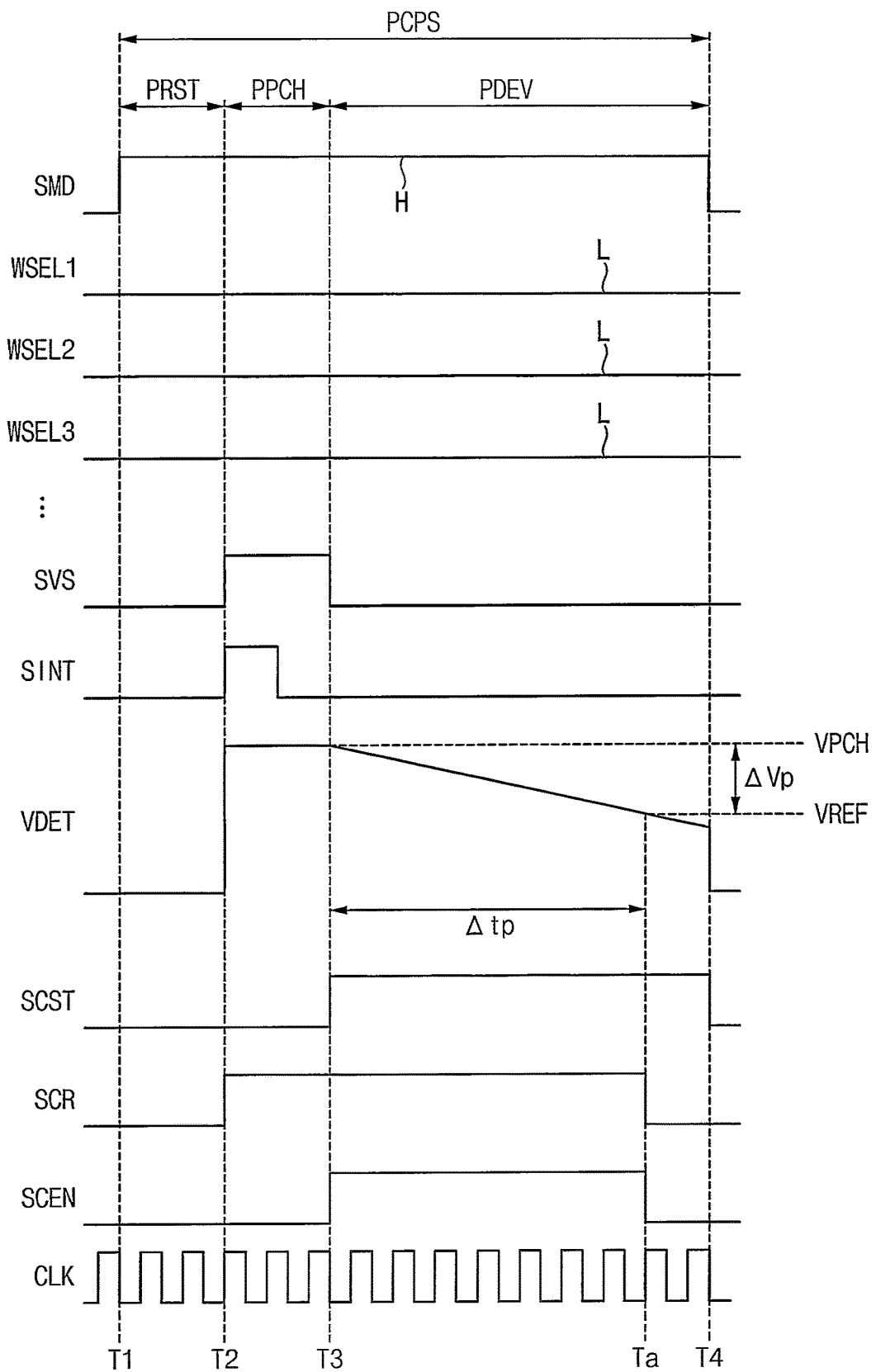
FIG. 11 is a timing diagram illustrating an example embodiment of an operation of a nonvolatile memory device including the compensation circuit of FIG. 10.

FIG. 11 is a timing diagram illustrating an example embodiment of an operation of a nonvolatile memory device including the compensation circuit of FIG. 10. Hereinafter, descriptions repeated with FIG. 8 may be omitted.

FIG. 11 illustrates the mode signal SMD, waveforms or transition timing of the plurality of wordline selection signals WSEL1~WSEL3, the voltage switch signal SVS, the initialization signal SINT, the detection voltage VDET, the counting start signal SCST, the comparison result signal SCR, the counting enable signal SCEN in a compensation period PCPS for measuring the path leakage current Ip. The compensation period PCPS may include a reset period PRST, a precharge period PPCH and a develop period PDEV between time points T1~T4.

Referring to FIGS. 7, 10 and 11, the nonvolatile memory device 10 may activate the mode signal SMD to turn on the mode switch SWM in the compensation period PCPS performing the compensation mode. In addition, the nonvolatile memory device 10 may deactivates all of the plurality of wordline selection signals WSEL1~WSEL3 to turn off all of the plurality of wordline switches SWW1~SWW3.

In the reset period PRST, the nonvolatile memory device 10 may initialize the operation status of the nonvolatile memory device 10.

In the precharge period PPCH, the nonvolatile memory device 10 may activate the voltage switch signal SVS to turn on the voltage switch SWV. In addition, the initialization signal SINT may be activated during at least a portion of the activation time duration of the voltage switch signal SVS to turn on the initialization switch SWI.

At the path develop start time point T3 when the voltage switch signal SVS is deactivated, the measurement voltage VMS starts decreasing by the path leakage current Ip and thus the detection voltage VDET, which is proportional to the measurement voltage VMS, starts to decrease.

The counting start signal SCST may be activated at the path develop start time point T3 and the counter input switch SWC may be turned on. At the path develop start time point T3, the comparison result signal SCR has the logic high level H and thus the counting enable signal SCEN transitions to the logic high level H. At the time point Ta when the detection voltage VDET becomes equal to the reference voltage VREF, the comparison result signal SCR transition to the logic low level L and thus the counting enable signal SCEN transitions to the logic low level L.

As a result, the counting enable signal SCEN may be activated at the path develop start time point T3 when the measurement voltage VMS starts decreasing after the measurement node NM is charged with the wordline voltage and the counting enable signal SCEN may be deactivated at the time point Ta when the detection voltage VDET proportional to the measurement voltage VMS becomes equal to the reference voltage VREF.

The counter 242 may count the clock number of the clock signal CLK during the leakage time Δtp corresponding to the activation time duration of the counting enable signal SCEN to provide the count value CNT indicating the leakage time Δtp where the leakage time Δtp is inversely proportional to the path leakage current Ip. The leakage time Δtp may correspond to a multiplication of the count value CNT and a cyclic period of the clock signal CLK.

Figure 12:
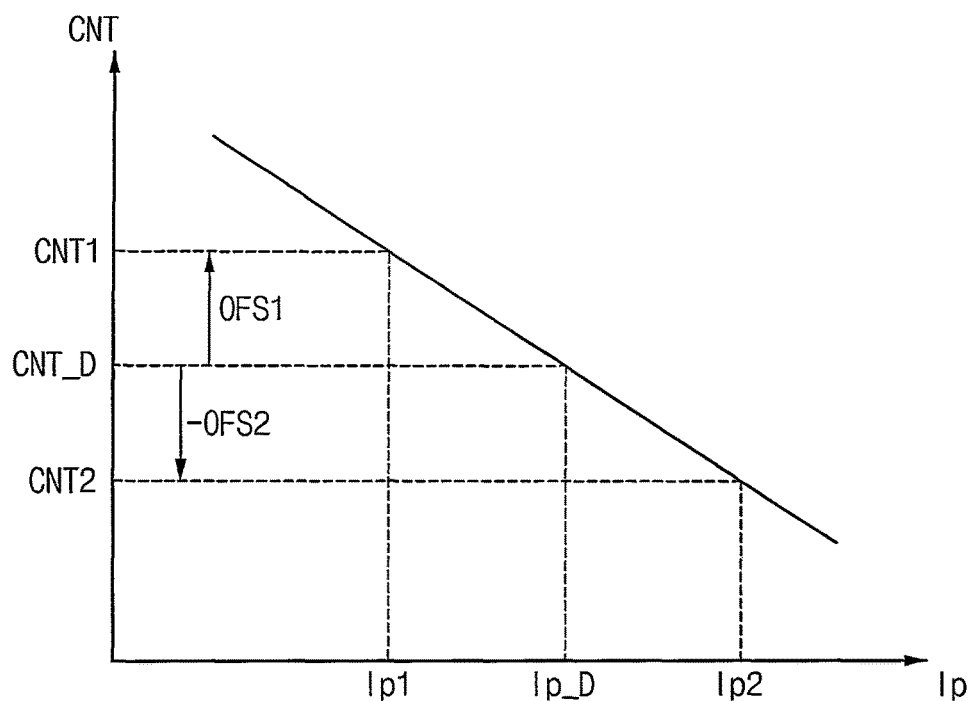
FIG. 12 is a diagram illustrating relationship between a path leakage current, a count value and an offset value provided from the compensation circuit of FIG. 10.
Figure 13:
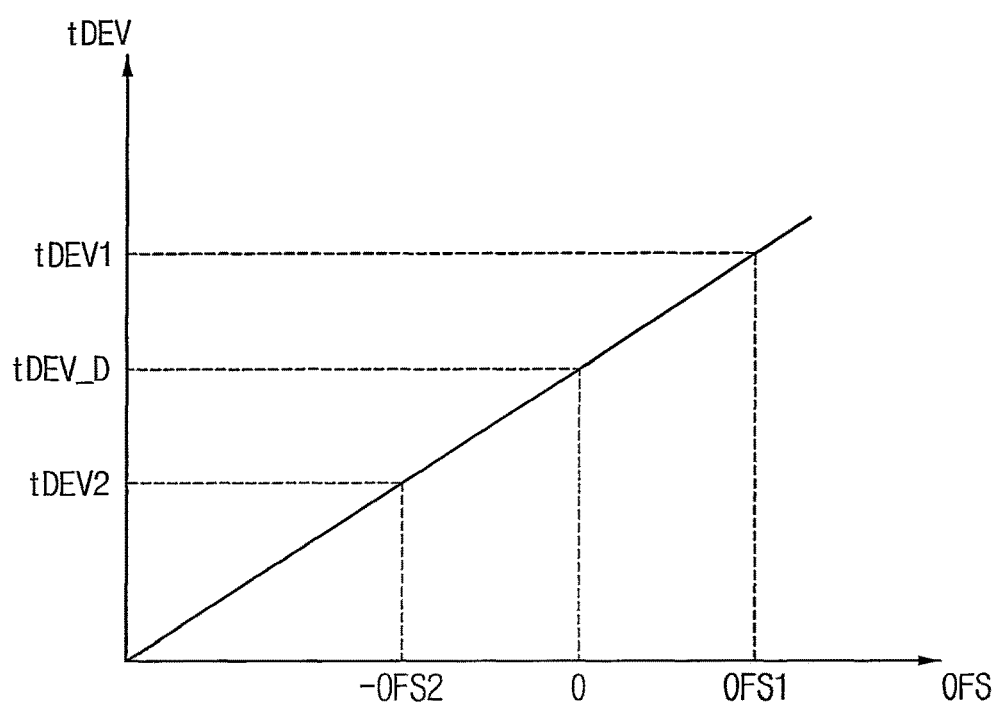
FIG. 13 is a diagram illustrating relationship between an offset value and a wordline develop time.

FIG. 12 is a diagram illustrating relationship between a path leakage current, a count value and an offset value provided from the compensation circuit of FIG. 10, and FIG. 13 is a diagram illustrating relationship between an offset value and a wordline develop time.

Referring to FIG. 12, the count value CNT may be inversely proportional to the path leakage current Ip, the calculation circuit 246 of the compensation circuit 240 provide the offset value OFS by subtracting the default count value CNT_D from the measured count value CNT. The default count value CNT_D corresponds to a default path leakage current Ip_D. For example, when the path leakage current Ip is a first current Ip1 lower than the default path leakage current Ip_D, the count value CNT is a first count value CNT1 greater than the default count value CNT_D, and the offset value OFS is a first offset value OFS1 corresponding to a positive value. In contrast, when the path leakage current Ip is a second current Ip2 higher than the default path leakage current Ip_D, the count value CNT is a second count value CNT2 smaller than the default count value CNT_D, and the offset value OFS is a second offset value −OFS2 corresponding to a negative value.

Referring to FIG. 13, the test controller 300 may control the wordline develop time tDEV such that the wordline develop time tDEV may be proportional to the offset value OFS. For example, when the offset value OFS is the second offset value −OFS2 corresponding to a negative value, the test controller 300 may determine the wordline develop time tDEV as a second wordline develop time tDEV2 shorter than a default wordline develop time tDEV_D. In contrast, when the offset value OFS is the first offset value OFS1 corresponding to a positive value, the test controller 300 may determine the wordline develop time tDEV as a first wordline develop time tDEV1 longer than the default wordline develop time tDEV_D.

As such, as the path leakage current Ip decreases, the wordline develop time tDEV may be increased to reinforce the criteria to for wordline defect to enhance the accuracy of determining the defective wordline. In contrast, as the path leakage current Ip increases, the wordline develop time tDEV may be decreased alleviate the criteria to for wordline defect to increase yield of the nonvolatile memory device.

Figure 14:
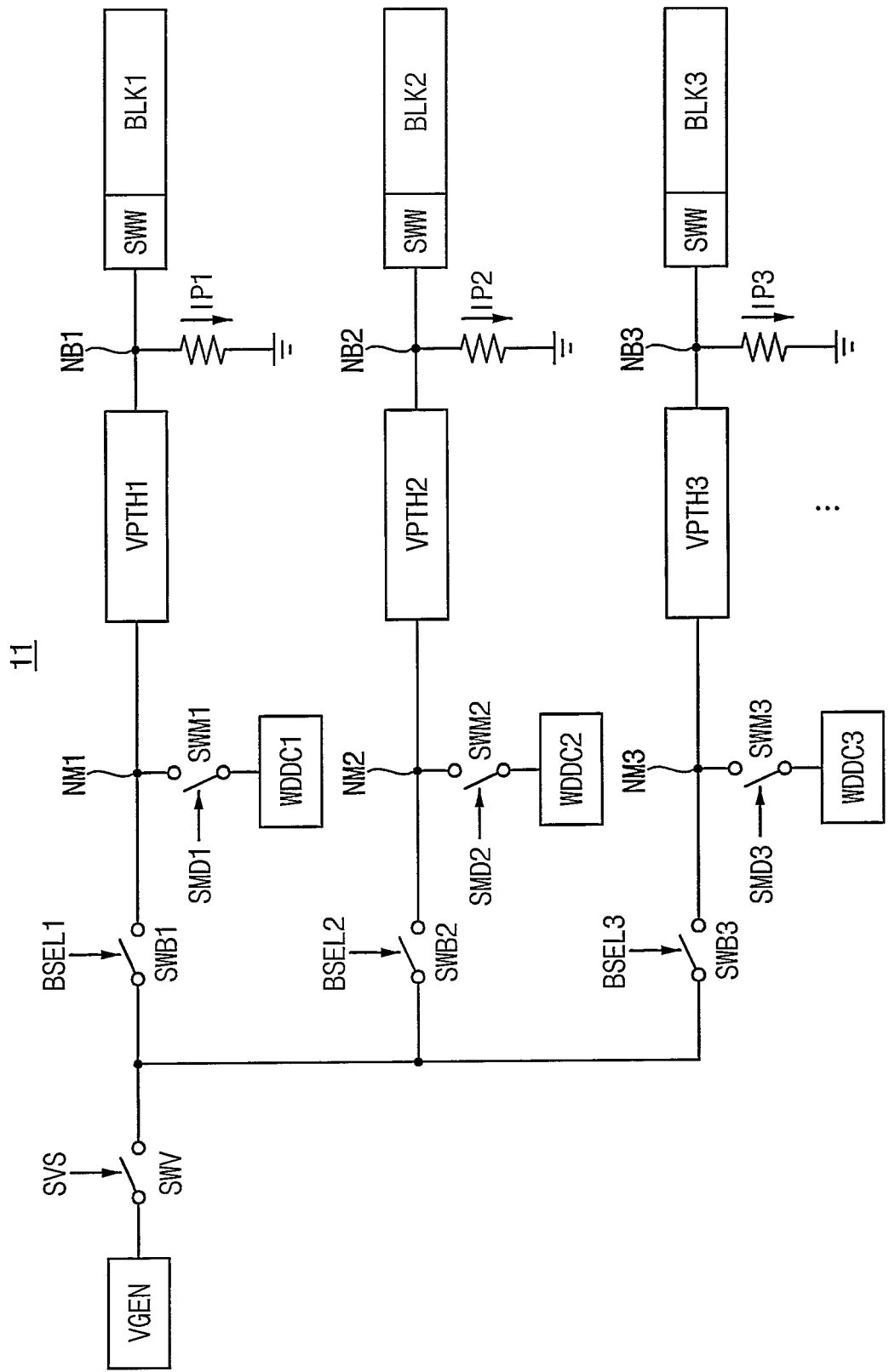
FIGS. 14 and 15 are diagrams illustrating a nonvolatile memory device according to some example embodiments.
Figure 15:
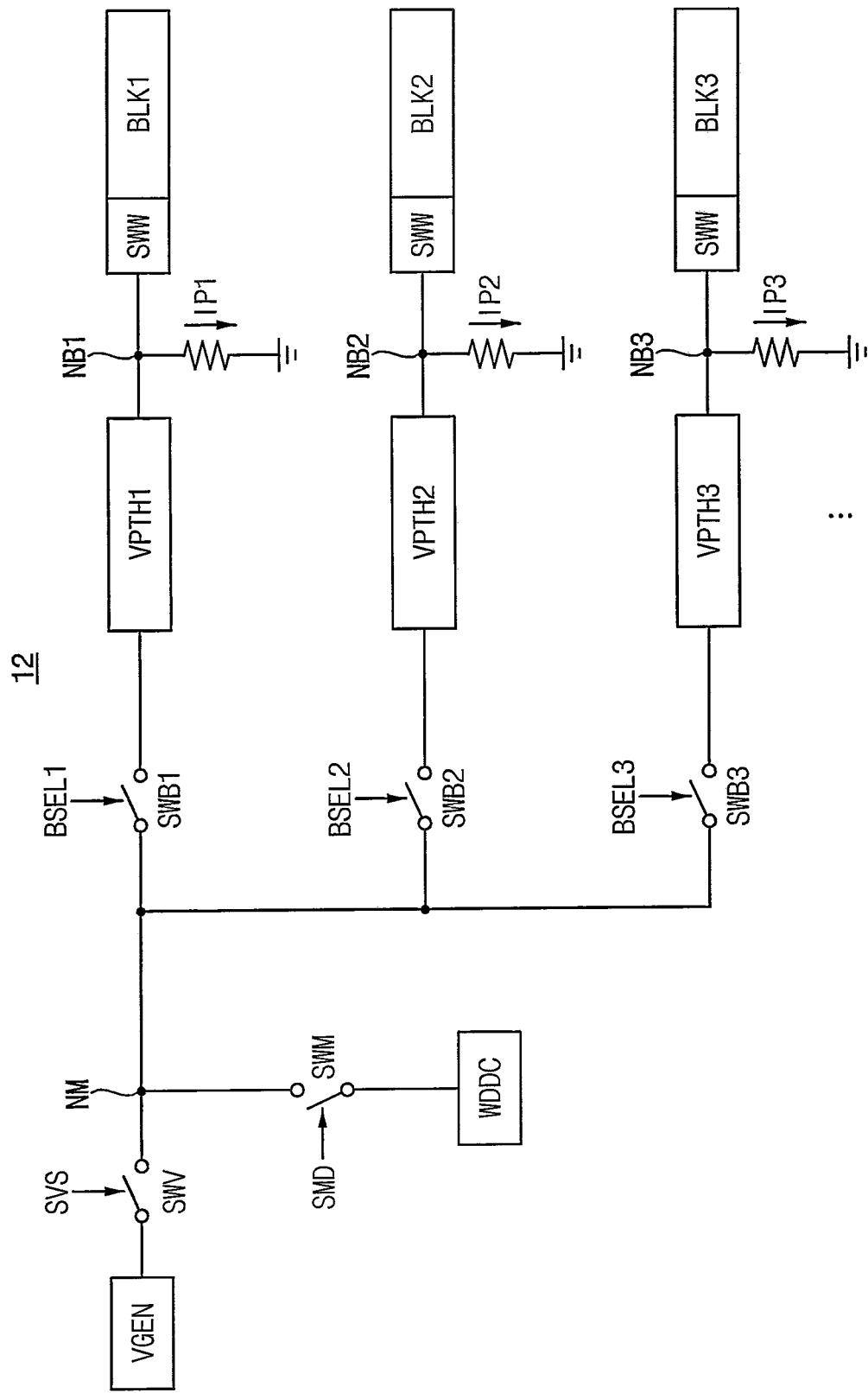

FIGS. 14 and 15 are diagrams illustrating a nonvolatile memory device according to some example embodiments.

Referring to FIGS. 14 and 15, nonvolatile memory devices 11 and 12 may include a plurality of memory blocks BLK1~BLK3. Three memory blocks are illustrated in FIGS. 14 and 15 for convenience of illustration and description, and the number of memory block included in the memory cell array of the nonvolatile memory device may be determined by various methods. Each of first through third memory blocks BLK1~BLK3 may include a plurality of wordlines. A plurality of wordline switches SWW to connect each of first through third voltage path circuits VPTH1~VPTH3 may be disposed between each of the first through third voltage path circuits VPTH1~VPTH3 and each of the first through third memory blocks BLK1~BLK3.

The wordline voltage generated by the voltage generator VGEN may be applied to each of the first through third voltage path circuits VPTH1~VPTH3 through voltage switch SWV and each of first through third block switches SWB1~SWB3, where the voltage switch SWV is turned on based on a voltage switch signal SVS and each of the first through third block switches SWB1~SWB3 is turned on based on each of first through third block selection signals BSEL1~BSEL3.

In some example embodiments, as illustrated in FIG. 14, one wordline defect detection circuit may be assigned to each memory block of a plurality of memory blocks.

A first wordline defect detection circuit WDDC1 may be connected, through a first mode switch SWM1, to a first measurement node NM1 between the first block switch SWB1 and the first voltage path circuit VPTH1. A second wordline defect detection circuit WDDC2 may be connected, through a second mode switch SWM2, to a second measurement node NM2 between the second block switch SWB2 and the second voltage path circuit VPTH2. A third wordline defect detection circuit WDDC3 may be connected, through a third mode switch SWM3, to a third measurement node NM3 between the third block switch SWB3 and the third voltage path circuit VPTH3.

The first wordline defect detection circuit WDDC1 may measure a first path leakage current Ip1 of the first voltage path circuit VPTH1 and provide a first offset value corresponding to the first path leakage current Ip1. The second wordline defect detection circuit WDDC2 may measure a second path leakage current Ip2 of the second voltage path circuit VPTH2 and provide a second offset value corresponding to the second path leakage current Ip2. The third wordline defect detection circuit WDDC3 may measure a third path leakage current Ip3 of the third voltage path circuit VPTH3 and provide a third offset value corresponding to the third path leakage current Ip3.

In some example embodiments, as illustrated in FIG. 15, the wordline defect detection circuit WDDC may be shared by a plurality of memory blocks.

The wordline defect detection circuit WDDC may be connected, through a mode switch SWM, to a measurement node NM between the voltage switch SWV and the block switches SWB1~SWB3.

The wordline defect detection circuit WDDC may measure at least one of the first through third path leakage currents Ip1~Ip3 of the first through third voltage path circuits VPTH1~VPTH3 to provide an offset value OFS commonly applied to the first through third path leakage currents Ip1~Ip3.

Figure 16:
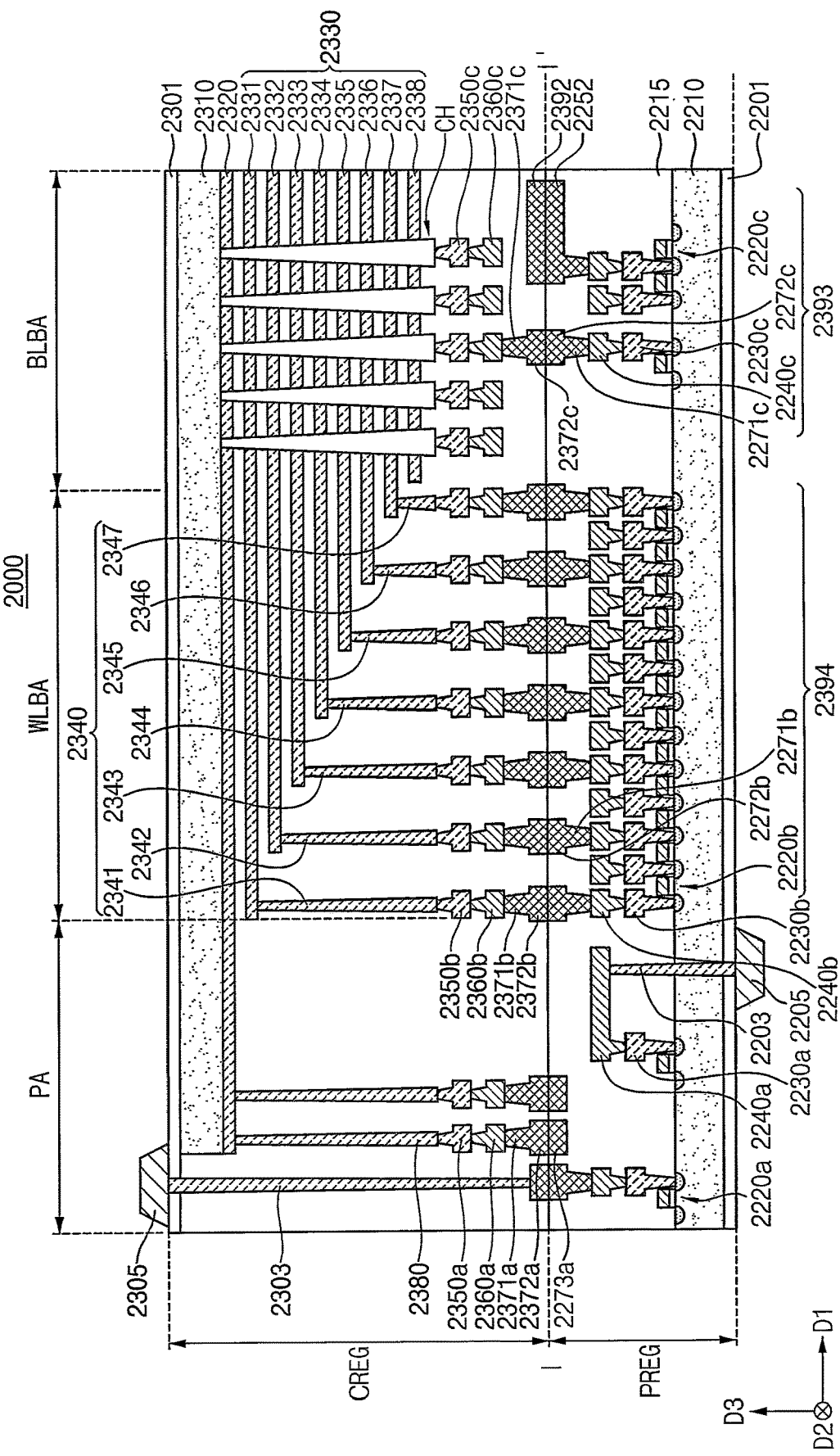
FIG. 16 is a cross-sectional diagram illustrating a nonvolatile memory device according to some example embodiments.

FIG. 16 is a cross-sectional diagram illustrating a nonvolatile memory device according to some example embodiments.

Referring to FIG. 16, a nonvolatile memory device 2000 may have a chip-to-chip (C2C) structure. Here, the term "C2C structure" denotes a structure in which an upper chip includes a memory cell region (e.g., the cell region CREG) on a first wafer, and a lower chip includes a peripheral circuit region (e.g., the peripheral region PREG) on a second wafer, in which the upper chip and the lower chip are bonded (or mounted) together at a bonding surface I-I'. In this regard, the bonding process may include a method of electrically connecting a bonding metal formed on an uppermost metal layer of the upper chip and a bonding metal formed on an uppermost metal layer of the lower chip. For example, when the bonding metals include copper (Cu), Cu-to-Cu bonding may be utilized. Example embodiments, however, are not limited thereto. For example, the bonding metals may also be formed of aluminum (Al) or tungsten (W).

Each of the peripheral region PREG and the cell region CREG of the nonvolatile memory device 2000 may include an external pad bonding area PA, a wordline bonding area WLBA, and a bitline bonding area BLBA.

The peripheral region PREG may include a first substrate 2210, an interlayer insulating layer 2215, circuit elements 2220a, 2220b, and 2220c formed on the first substrate 2210, first metal layers 2230a, 2230b, and 2230c respectively connected to the circuit elements 2220a, 2220b, and 2220c, and second metal layers 2240a, 2240b, and 2240c formed on the first metal layers 2230a, 2230b, and 2230c. In some example embodiments, the first metal layers 2230a, 2230b, and 2230c may be formed of tungsten having relatively high electrical resistivity, and the second metal layers 2240a, 2240b, and 2240c may be formed of copper having relatively low electrical resistivity.

In some example embodiments, such as the example embodiment of FIG. 16, although only the first metal layers 2230a, 2230b, and 2230c and the second metal layers 2240a, 2240b, and 2240c are shown and described, example embodiments are not limited thereto. For example, in some example embodiments, one or more additional metal layers may be further formed on the second metal layers 2240a, 2240b, and 2240c. At least a portion of the one or more additional metal layers formed on the second metal layers 2240a, 2240b, and 2240c may be formed of, for example, aluminum or the like having a lower electrical resistivity than those of copper forming the second metal layers 2240a, 2240b, and 2240c.

The interlayer insulating layer 2215 may be disposed on the first substrate 2210 and cover the circuit elements 2220a, 2220b, and 2220c, the first metal layers 2230a, 2230b, and 2230c, and the second metal layers 2240a, 2240b, and 2240c. The interlayer insulating layer 2215 may include an insulating material such as, for example, silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral region PREG may be electrically bonded to upper bonding metals 2371b and 2372b of the cell region CREG. The lower bonding metals 2271b and 2272b and the upper bonding metals 2371b and 2372b may be formed of, for example, aluminum, copper, tungsten, or the like. The upper bonding metals 2371b and 2372b in the cell region CREG may be referred as first metal pads, and the lower bonding metals 2271b and 2272b in the peripheral region PREG may be referred as second metal pads.

The cell region CREG may include at least one memory block. The cell region CREG may include a second substrate 2310 and a common source line 2320. On the second substrate 2310, wordlines 2331, 2332, 2333, 2334, 2335, 2336, 2337, and 2338 (collectively, 2330) may be vertically stacked (in the direction D3 or a Z-axis) perpendicular to an upper surface of the second substrate 2310. At least one string selection line and at least one ground selection line may be arranged on and below the wordlines 2330, respectively, and the wordlines 2330 may be disposed between the at least one string selection line and the at least one ground selection line.

In the bitline bonding area BLBA, a channel structure CH may vertically extend perpendicular to the upper surface of the second substrate 2310, and pass through the wordlines 2330, the at least one string selection line, and the at least one ground selection line. The channel structure CH may include, for example, a data storage layer, a channel layer, a buried insulating layer, and the like. The channel layer may be electrically connected to a first metal layer 2350c and a second metal layer 2360c. For example, the first metal layer 2350c may be a bitline contact, and the second metal layer 2360c may be a bitline. In an example embodiment, the bitline (the second metal layer 2360c) may extend in a second horizontal direction D2 (e.g., a Y-axis direction) parallel to the upper surface of the second substrate 2310.

In the illustrated example of FIG. 16, an area in which the channel structure CH, the bitline (the second metal layer 2360c), and the like are disposed may be defined as the bitline bonding area BLBA. Restated, the bitline bonding area BLBA may include the channel structure CH, bitline, and the like. In the bitline bonding area BLBA, the bitline (the second metal layer 2360c) may be electrically connected to the circuit elements 2220c providing a page buffer 2393 in the peripheral region PREG. The bitline (the second metal layer 2360c) may be connected to upper bonding metals 2371c and 2372c in the cell region CREG, and the upper bonding metals 2371c and 2372c may be connected to lower bonding metals 2271c and 2272c connected to the circuit elements 2220c of the page buffer 2393.

In the wordline bonding area WLBA, the wordlines 2330 may extend in a first horizontal direction D1 (e.g., an X-axis direction) parallel to the upper surface of the second substrate 2310 and perpendicular to the second horizontal direction D2, and may be connected to cell contact plugs 2341, 2342, 2343, 2344, 2345, 2346, and 2347 (collectively, 2340). The wordlines 2330 and the cell contact plugs 2340 may be connected to each other in pads provided by at least a portion of the wordlines 2330 extending in different lengths in the first horizontal direction D1. A first metal layer 2350b and a second metal layer 2360b may be connected to an upper portion of the cell contact plugs 2340 connected to the wordlines 2330, sequentially. The cell contact plugs 2340 may be connected to the peripheral region PREG by the upper bonding metals 2371b and 2372b of the cell region CREG and the lower bonding metals 2271b and 2272b of the peripheral region PREG in the wordline bonding area WLBA.

The cell contact plugs 2340 may be electrically connected to the circuit elements 2220b forming a row decoder 2394 in the peripheral region PREG. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as, for example, a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

I/O pads 2205 and 2305 may be disposed in the external pad bonding area PA. A lower insulating film 2201 covering a lower surface of the first substrate 2210 may be formed below the first substrate 2210, and a first I/O pad 2205 may be formed on the lower insulating film 2201. The first I/O pad 2205 may be connected to at least one of the circuit elements 2220a, 2220b, and 2220c disposed in the peripheral region PREG through a first I/O contact plug 2203 and may be separated from the first substrate 2210 by the lower insulating film 2201. In addition, a side insulating film may be disposed between the first I/O contact plug 2203 and the first substrate 2210 to electrically separate the first I/O contact plug 2203 and the first substrate 2210.

An upper insulating film 2301 covering the upper surface of the second substrate 2310 may be formed on the second substrate 2310, and a second I/O pad 2305 may be disposed on the upper insulating film 2301. The second I/O pad 2305 may be connected to at least one of the circuit elements 2220a, 2220b, and 2220c disposed in the peripheral region PREG through a second I/O contact plug 2303. In some example embodiments, the second I/O pad 2305 is electrically connected to a circuit element 2220a.

In some example embodiments, the second substrate 2310 and the common source line 2320 are not disposed in an area in which the second I/O contact plug 2303 is disposed. Also, in some example embodiments, the second I/O pad 2305 does not overlap the wordlines 2330 in the vertical direction D3 (e.g., the Z-axis direction). The second I/O contact plug 2303 may be separated from the second substrate 2310 in the direction parallel to the upper surface of the second substrate 310 and may pass through the interlayer insulating layer 2315 of the cell region CREG to be connected to the second I/O pad 2305.

According to some example embodiments, the first I/O pad 2205 and the second I/O pad 2305 may be selectively formed. For example, in some example embodiments, the nonvolatile memory device 2000 may include only the first I/O pad 2205 disposed on the first substrate 2210 or the second I/O pad 2305 disposed on the second substrate 2310. Alternatively, in some example embodiments, the memory device 200 may include both the first I/O pad 2205 and the second I/O pad 2305.

A metal pattern provided on an uppermost metal layer may be provided as a dummy pattern or the uppermost metal layer may be absent, in each of the external pad bonding area PA and the bitline bonding area BLBA, respectively included in the cell region CREG and the peripheral region PREG.

In the external pad bonding area PA, the nonvolatile memory device 2000 may include a lower metal pattern 2273a, corresponding to an upper metal pattern 2372a formed in an uppermost metal layer of the cell region CREG, and having the same cross-sectional shape as the upper metal pattern 2372a of the cell region CREG so as to be connected to each other, in an uppermost metal layer of the peripheral region PREG. In some example embodiments, in the peripheral region PREG, the lower metal pattern 2273a formed in the uppermost metal layer of the peripheral region PREG is not connected to a contact. In a similar manner, in the external pad bonding area PA, an upper metal pattern 2372a, corresponding to the lower metal pattern 2273a formed in an uppermost metal layer of the peripheral region PREG, and having the same shape as a lower metal pattern 2273a of the peripheral region PREG, may be formed in an uppermost metal layer of the cell region CREG.

The lower bonding metals 2271b and 2272b may be formed on the second metal layer 2240b in the wordline bonding area WLBA. In the wordline bonding area WLBA, the lower bonding metals 2271b and 2272b of the peripheral region PREG may be electrically connected to the upper bonding metals 2371b and 2372b of the cell region CREG by, for example, Cu-to-Cu bonding.

Further, in the bitline bonding area BLBA, an upper metal pattern 2392, corresponding to a lower metal pattern 2252 formed in the uppermost metal layer of the peripheral region PREG, and having the same cross-sectional shape as the lower metal pattern 2252 of the peripheral region PREG, may be formed in an uppermost metal layer of the cell region CREG. In some example embodiments, a contact is not formed on the upper metal pattern 2392 formed in the uppermost metal layer of the cell region CREG.

The peripheral circuits such as the voltage generator, the voltage path circuit, the wordline defect detection circuit, the voltage switch, the wordline switches, and the mode switch as described above may be formed in the peripheral region PREG.

Figure 17:
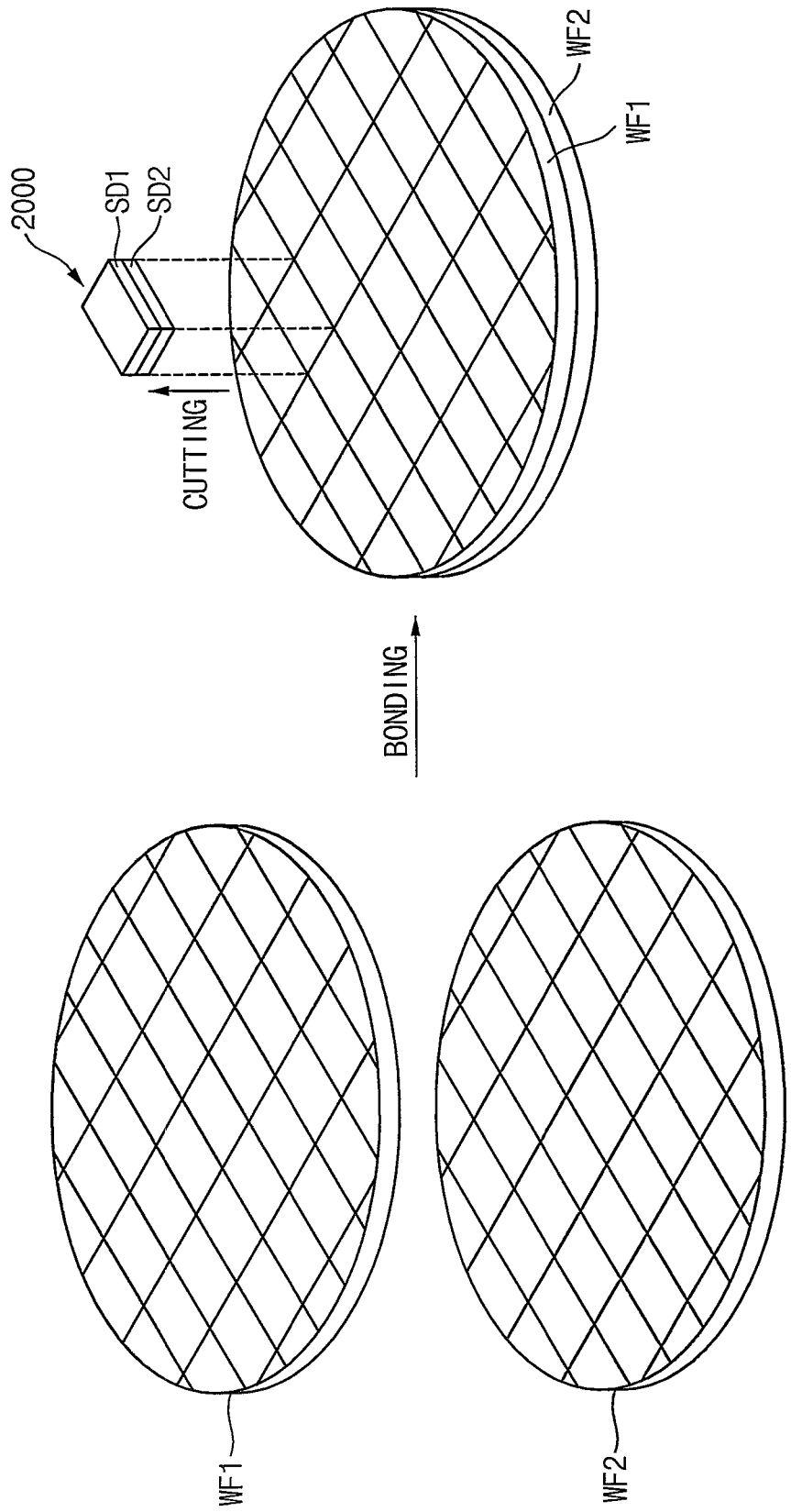
FIG. 17 is a conceptual diagram illustrating manufacture of a stacked semiconductor device according to some example embodiments.

FIG. 17 is a conceptual diagram illustrating manufacture of a stacked semiconductor device according to some example embodiments.

Referring to FIG. 17, respective integrated circuits may be formed on a first wafer WF1 and a second wafer WF2. The memory cell array may be formed in the first wafer WF1 and the peripheral circuits such as the voltage generator, the voltage path circuit, the wordline defect detection circuit, the voltage switch, the wordline switches, and the mode switch as described above may be formed in the second wafer WF2.

After the various integrated circuits have been respectively formed on the first and second wafers WF1 and WF2, the first wafer WF1 and the second wafer WF2 may be bonded together. The bonded wafers WF1 and WF2 may then be cut (or divided) into separate chips, in which each chip corresponds to a semiconductor device such as, for example, the nonvolatile memory device 2000, including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to the second semiconductor die SD2.

Figure 18:
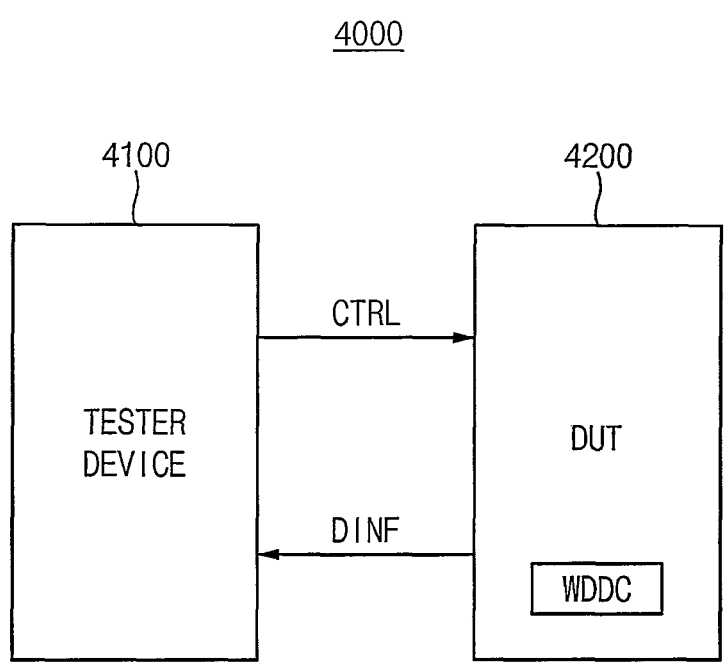
FIG. 18 is a block diagram illustrating a test system according to some example embodiments.

FIG. 18 is a block diagram illustrating a test system according to some example embodiments.

Referring to FIG. 18, a test system 4000 may include a tester device 4100 and a device under test DUT 4200.

The device under test 4200 may be a nonvolatile memory device or a device or system including a nonvolatile memory device. The device under test 4200 may be a wafer before the nonvolatile memory device 2000 is cut from the wafer as described with reference to FIG. 17, or a memory package including a cut nonvolatile memory device 2000.

The device under test 4200 may include the wordline defect detection circuit WDDC as described above. The tester device 4100 may transfer control signals CTRL to the device under test 4200 to control the wordline defect detection circuit WDDC. The device under test 4200 may provide defect information DINF, which may be obtained using the wordline defect detection circuit WDDC, to the tester device 4100. The defect information DINF may include the count value CNT, the offset value OFS and/or pass-fail information of wordlines as described above.

According to some example embodiments, at least a portion of the wordline defect detection circuit WDDC may be implemented in the tester device 4100. For example, the above-described calculation circuit 246 may be disposed in the tester device 4100. In this case, the device under test 4200 may provide the count value CNT to the tester device 4100, and the tester device 4100 may calculate the offset value OFS corresponding to the count value CNT and the control signal CTRL to control the wordline develop time tDEV corresponding to the offset value OFS to the device under test 4200.

Figure 19:
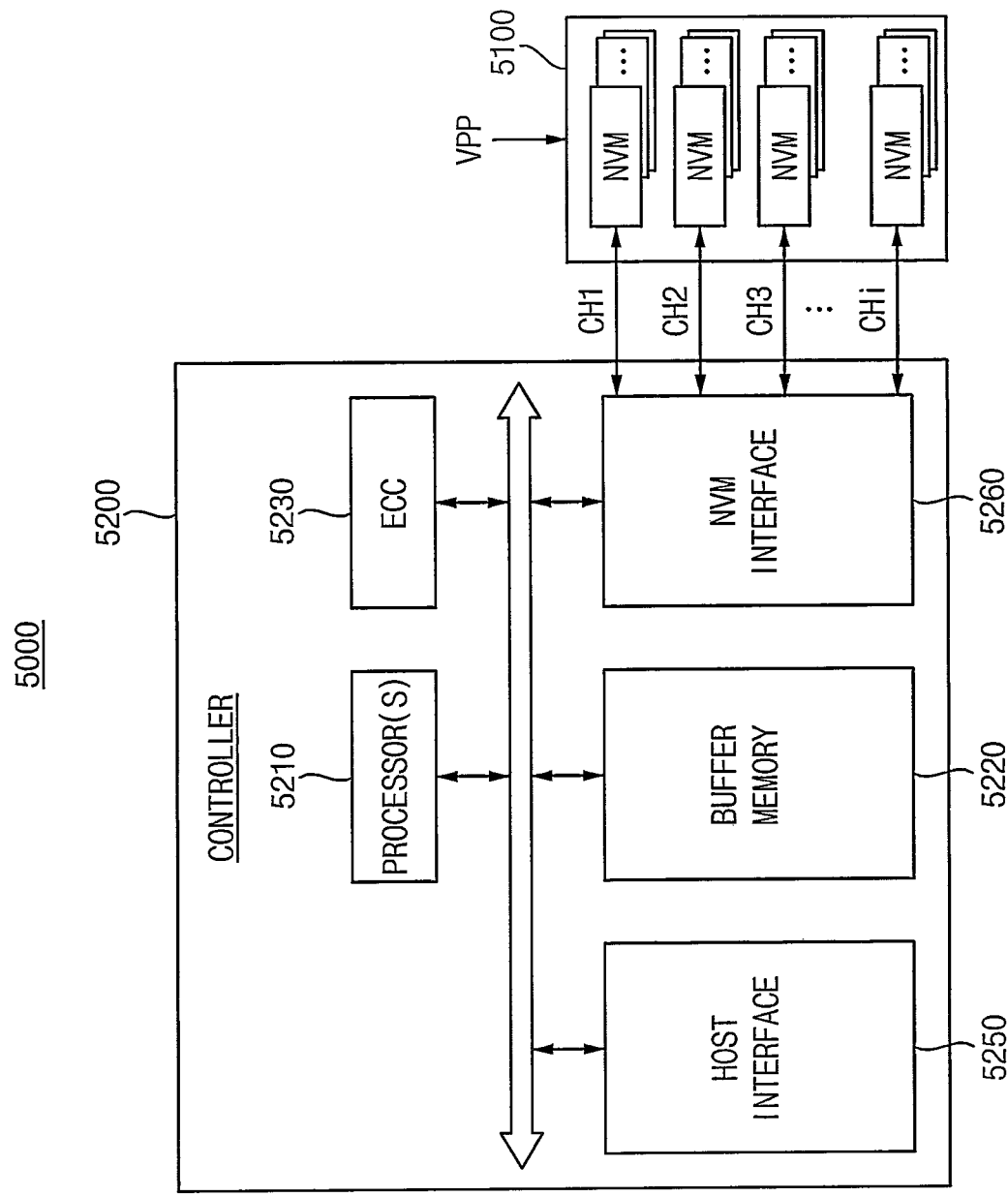
FIG. 19 is a block diagram illustrating a storage device according to some example embodiments.

FIG. 19 is a block diagram illustrating a storage device according to some example embodiments.

Referring to FIG. 19, a storage device 5000 may be a solid state driver (SSD) 5000. The SSD may generally include nonvolatile memory devices 5100 and an SSD controller 5200.

The nonvolatile memory devices 5100 may (optionally) be configured to receive a high voltage VPP. One or more of the nonvolatile memory devices 5100 may be provided as memory device(s) according to some example embodiments of the inventive concept described above. Accordingly, the nonvolatile memory devices 5100 may measure the path leakage current and determine wordline defect adaptively by reflecting the measured path leakage current.

The SSD controller 5200 is connected to the nonvolatile memory devices 5100 via multiple channels CH1, CH2, CH3, . . . Chi, in which i is a natural number. The SSD controller 1200 includes one or more processors 5210, a buffer memory 5220, an error correction code (ECC) circuit 5230, a host interface 5250, and a nonvolatile memory interface 5260. The buffer memory 5220 stores data used to drive the SSD controller 5200. The buffer memory 5220 includes multiple memory lines, each storing data or a command. The ECC circuit 5230 calculates error correction code values of data to be programmed at a writing operation and corrects an error of read data using an error correction code value at a read operation. In a data recovery operation, The ECC circuit 5230 corrects an error of data recovered from the nonvolatile memory devices 5100.

Additionally, the memory controller 20, memory device 30, test device 4100, controller 5200 and/or the components included therein may include processing circuitry such as hardware including logic circuits; a hardware/software combination such as a processor executing software; or a combination thereof. For example, the processing circuitry may include, but is not limited to, a central processing unit (CPU), a memory controller, an arithmetic logic unit (ALU), a digital signal processor, a microcomputer, a field programmable gate array (FPGA), and programmable logic unit, a microprocessor, application-specific integrated circuit (ASIC), etc.

As described above, the nonvolatile memory device and the method of detecting wordline defect according to some example embodiments may efficiently screen defective wordlines and enhance defect detection capability and yield of the nonvolatile memory device, by measuring the path leakage current of the voltage path circuit and determining criteria of wordline defect depending on the measured path leakage current.

In addition, the nonvolatile memory device and the method of detecting wordline defect according to some example embodiments may efficiently improve design and manufacturing process of the nonvolatile memory device by detecting the path leakage current independently of other leakage currents to exactly identify the defect source.

Example embodiments may be applied to any electronic devices and systems including a nonvolatile memory device. For example, example embodiments may be applied to systems such as a memory card, a solid state drive (SSD), an embedded multimedia card (eMMC), a universal flash storage (UFS), a mobile phone, a smartphone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an Internet of Things (IoT) device, an Internet of Everything (IoE) device, an e-book, a virtual reality (VR) device, an augmented reality (AR) device, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A nonvolatile memory device comprising:
   a memory cell array including a plurality of cell strings and a plurality of wordlines, each of the plurality of cell strings including memory cells, each of the plurality of wordlines connected to at least one of the memory cells, the plurality of cell strings being connected between a plurality of bitlines and a source line;
   a voltage generator configured to generate a wordline voltage applied to the plurality of wordlines;
   a voltage path circuit connected between the voltage generator and the memory cell array and configured to transfer the wordline voltage to the plurality of wordlines; and
   a wordline defect detection circuit connected to a measurement node between the voltage generator and the voltage path circuit and configured to
      measure a path leakage current of the voltage path circuit based on a measurement voltage of the measurement node to generate an offset value corresponding to the path leakage current in a compensation mode, and
      determine, for each of the plurality of wordlines, whether a defect exists based on the offset value and the measurement voltage in a defect detection mode.

2. The nonvolatile memory device of claim 1, further comprising:
   a voltage switch configured to electrically connect the voltage generator to the measurement node based on a voltage switch signal;
   a plurality of wordline switches configured to electrically connect the voltage path circuit to each wordline of the plurality of wordlines based on each wordline selection signal of a plurality of wordline selection signals;
   a mode switch configured to electrically connect the wordline defect detection circuit to the measurement node based on a mode signal; and
   a controller configured to generate, the voltage switch signal, the plurality of wordline selection signals and the mode signal.

3. The nonvolatile memory device of claim 2, wherein, the controller is configured to, in the compensation mode, deactivate all of the plurality of wordline selection signals to turn off all of the plurality of wordline switches such that the measurement voltage is decreased by the path leakage current independent of a plurality of wordline leakage currents of the plurality of wordlines.

4. The nonvolatile memory device of claim 3, wherein, the controller is configured to, in the defect detection mode, activate one wordline selection signal of the plurality of wordline selection signals and deactivate the other wordline selection signals to turn on one wordline switch of the plurality of wordline switches and turn off the other wordline switches such that the measurement voltage is decreased by both of the path leakage current and one wordline leakage current of one wordline corresponding to the one wordline switch that is turned on.

5. The nonvolatile memory device of claim 2, wherein the controller is configured to
   activate the mode signal to turn on the mode switch in the compensation mode and the defect detection mode, and
   deactivate the mode signal to turn off the mode switch in a normal operation mode of the nonvolatile memory device.

6. The nonvolatile memory device of claim 1, wherein, the wordline defect detection circuit is configured to, in the compensation mode,
   measure a leakage time that is inversely proportional to the path leakage current based on the measurement voltage and a reference voltage and
   generate the offset value that is proportional to the leakage time.

7. The nonvolatile memory device of claim 6, wherein, the wordline defect detection circuit is configured to, in the defect detection mode, determine whether each wordline leakage current of each wordline exceeds a threshold value, based on the measurement voltage and the reference voltage at a latch time point that is determined based on the offset value, and determine, for each of the plurality of wordlines, whether a defect exists based on a result of determining whether each wordline leakage exceeds the threshold value.

8. The nonvolatile memory device of claim 7, wherein a wordline develop time between a wordline develop start time point and the latch time point is proportional to the offset value, and wherein the measurement voltage starts decreasing at the wordline develop start time point after the measurement node is charged with the wordline voltage.

9. The nonvolatile memory device of claim 1, wherein the wordline defect detection circuit includes:

a comparison circuit configured to generate a comparison result signal based on a reference voltage and the measurement voltage decreasing by the path leakage current in the compensation mode and generate the comparison result signal based on the reference voltage and the measurement voltage decreasing by both of the path leakage current and each wordline leakage current in the defect detection mode;

a compensation circuit configured to generate the offset value based on transition timing of the comparison result signal in the compensation mode; and a defect determination circuit configured to generate a pass-fail signal indicating weather a defect exits in each wordline based on a logic level of the comparison result signal at a latch time point that is determined based on the offset value in the defect detection mode.

10. The nonvolatile memory device of claim 9, wherein the comparison circuit includes:

a first capacitor connected between the measurement node and a detection node;

a second capacitor connected between the detection node and a ground voltage; and a comparator configured to compare a detection voltage of the detection node and the reference voltage to generate the comparison result signal.

11. The nonvolatile memory device of claim 10, wherein the comparison circuit further includes:

an initialization switch configured to reset the detection voltage to an initialization voltage based on an initialization signal.

12. The nonvolatile memory device of claim 9, wherein the compensation circuit includes:

a counter input switch connected to an output node of the comparison circuit providing the comparison result signal and configured to be turned on based on a counting start signal to generate a counting enable signal;

a counter configured to count a clock number of a clock signal during an activation time duration of the counting enable signal to provide a count value indicating a leakage time that is inversely proportional to the path leakage current; and a register configured to store the count value provided from the counter.

13. The nonvolatile memory device of claim 12, further comprising a controller configured to activate the counting enable signal at a path develop start time point when the measurement voltage starts decreasing after the measurement node is charged with the wordline voltage and deactivate the counting enable signal at a time point when a detection voltage proportional to the measurement voltage becomes equal to the reference voltage.

14. The nonvolatile memory device of claim 12, wherein the compensation circuit further includes:

a calculation circuit configured to subtract a default count value from the count value stored in the register to provide the offset value.

15. The nonvolatile memory device of claim 9, wherein the defect determination circuit includes:

a latch circuit configured to latch a logic level of the comparison result signal based on a latch signal that is activated at the latch time point to output the pass-fail signal.

16. The nonvolatile memory device of claim 1, wherein the nonvolatile memory device is a vertical NAND flash memory device in which the memory cells in each cell string are stacked in a vertical direction.

17. The nonvolatile memory device of claim 1, wherein the memory cell array includes a plurality of memory blocks and the wordline defect detection circuit is assigned to each memory block of the plurality of memory blocks.

18. The nonvolatile memory device of claim 1, wherein the memory cell array includes a plurality of memory blocks and the wordline defect detection circuit is shared by the plurality of memory blocks.

19. A nonvolatile memory device, comprising:

a plurality of first metal pads in a cell region;

a plurality of second metal pads in a peripheral region disposed under the cell region, wherein the peripheral region is vertically connected to the cell region by the first metal pads and the second metal pads;

a memory cell array in the cell region and including memory cells and a plurality of wordlines connected to the memory cells;

a voltage generator in the peripheral region and configured to generate a wordline voltage applied to the plurality of wordlines;

a voltage path circuit in the peripheral region, connected between the voltage generator and the memory cell array and configured to transfer the wordline voltage to the plurality of wordlines; and a wordline defect detection circuit in the peripheral region, connected to a measurement node between the voltage generator and the voltage path circuit and configured to measure a path leakage current of the voltage path circuit based on a measurement voltage of the measurement node to generate an offset value corresponding to the path leakage current in a compensation mode, and determine, for each of the plurality of wordlines, whether a defect exists based on the offset value and the measurement voltage in a defect detection mode.

20. A method of detecting wordline defect of a nonvolatile memory device, comprising:

measuring a path leakage current of a voltage path circuit to generate an offset value corresponding to the path leakage current in a compensation mode, the voltage path circuit providing a wordline voltage generated by a voltage generator to a plurality of wordlines; and determining, for each wordline of the plurality of wordlines, whether a defect exists based on the offset value in a defect detection mode.

* * * * *